(12) United States Patent
Nguyen et al.

(10) Patent No.: US 6,888,742 B1
(45) Date of Patent: May 3, 2005

(54) OFF-AXIS PINNED LAYER MAGNETIC ELEMENT UTILIZING SPIN TRANSFER AND AN MRAM DEVICE USING THE MAGNETIC ELEMENT

(75) Inventors: Paul P. Nguyen, San Jose, CA (US); Yiming Huai, Pleasanton, CA (US)

(73) Assignee: Grandis, Inc., Milpitas, CA (US)

( * ) Notice: Subject to any disclaimer, the term of this patent is extended or adjusted under 35 U.S.C. 154(b) by 291 days.

(21) Appl. No.: 10/231,430

(22) Filed: Aug. 28, 2002

(51) Int. Cl.$^7$ .............................................. G11C 11/00
(52) U.S. Cl. ...................... 365/158; 365/145; 365/171
(58) Field of Search .............................. 365/158, 145, 365/171, 117, 65

(56) References Cited

U.S. PATENT DOCUMENTS 6,396,734 B2 * 5/2002 Ishikawa et al. ............ 365/158

OTHER PUBLICATIONS

Albert, J.F. et al, "Spin–Polarized Current Switching of a CO Thin Film Nanomagnet," American Physics Letters, vol. 77, No. 23, Dec. 4, 2000, pp. 3809–3811.
Grollier, J. et al., "Spin–Polarized Current Induced Switchig in Co/Cu/Co Pillars," Applied Physics Letters, vol. 78, No. 23, Jun. 4, 2001, pp. 3663–3665.
Katine, J.A., et al., "Current–Driven Magnetization Reversal and Spin–Wave Excitations in Co/Cu/Co Pillars," The American Physical Society, vol. 84, No. 14, Apr. 3, 2000, pp. 3149–3151.
Slonczewski, J.C., "Conductance and Exchange Coupling of Two Ferromagnets Separated by a Tunneling Barrier," The American Physical Society, Physical Review B, Bol. 39, No. 10, Apr. 1, 1989, pp. 6995–7002.
Slonczewski, J.C., "Current–Driven Excitation of Magnetic Multilayers," Journal of Magnetism and Magnetic Materials, 1996, pp. 1.1–1.7.
Sun, J.Z., "Current–Driven Magnetic Switching in Manganite Trilayer Juntions," Journal of Magnetism and Magnetic Materials, No. 202, 1999, pp. 157–162.
Tehrani, S. et al., "Progress and Outlook for MRAM Technology," IEEE Transactions of Magnetics, vol. 35, No. 5, Sep. 1999, pp. 2814–2819.

* cited by examiner

Primary Examiner—David Lam
(74) Attorney, Agent, or Firm—Sawyer Law Group LLP

(57) ABSTRACT

A method and system for providing a magnetic element capable of being written in a reduced time using the spin-transfer effect while generating a high output signal and a magnetic memory using the magnetic element are disclosed. The magnetic element includes a ferromagnetic pinned layer, a nonmagnetic intermediate layer, and a ferromagnetic free layer. The pinned layer has a magnetization pinned in a first direction. The nonmagnetic intermediate layer resides between the pinned layer and the free layer. The free layer has a magnetization with an easy axis in a second direction. The first direction is in the same plane as the second direction and is oriented at an angle with respect to the second direction. This angle is different from zero and $\pi$ radians. The magnetic element is also configured to allow the magnetization of the free layer to change direction due to spin transfer when a write current is passed through the magnetic element.

42 Claims, 13 Drawing Sheets

OFF-AXIS PINNED LAYER MAGNETIC ELEMENT UTILIZING SPIN TRANSFER AND AN MRAM DEVICE USING THE MAGNETIC ELEMENT

CROSS-REFERENCE TO RELATED APPLICATIONS

This application is related to U.S. patent application Ser. No. 10/213,537, entitled "Magnetic Element Utilizing Spin Transfer and an MRAM Device Using the Magnetic Element," filed Aug. 6, 2002, and assigned to the Assignee of the present application.

FIELD OF THE INVENTION

The present invention relates to magnetic memory systems, and more particularly to a method and system for providing an element that employs a spin transfer effect in switching, that requires a lower current for switching, and that can be used in a magnetic memory such as magnetic random access memory ("MRAM").

BACKGROUND OF THE INVENTION

Magnetic memories are often used in storing data. One type of memory element currently of interest utilizes magnetoresistance of a magnetic element for storing data. FIGS. 1A and 1B depict conventional magnetic elements 1 and 1'. The conventional magnetic element 1 is a spin valve 1 and includes a conventional antiferromagnetic layer 2, a conventional pinned layer 4, a conventional spacer layer 6 and a conventional free layer 8. The conventional pinned layer 4 and the conventional free layer 8 are ferromagnetic. The conventional spacer layer 6 is nonmagnetic. The conventional spacer layer 6 is conductive. The antiferromagnetic layer 2 is used to fix, or pin, the magnetization of the pinned layer 4 in a particular direction. The magnetization of the free layer 8 is free to rotate, typically in response to an external field.

The conventional magnetic element 1' is a spin tunneling junction. Portions of the conventional spin tunneling junction 1' are analogous to the conventional spin valve 1. Thus, the conventional magnetic element 1' includes an antiferromagnetic layer 2', a conventional pinned layer 4', an insulating barrier layer 6' and a free layer 8'. The conventional barrier layer 6' is thin enough for electrons to tunnel through in a conventional spin tunneling junction 1'.

Depending upon the orientations of the magnetizations of the free layer 8 or 8' and the pinned layer 4 or 4', respectively, the resistance of the conventional magnetic element 1 or 1', respectively, changes. When the magnetizations of the free layer 8 and pinned layer 4 are parallel, the resistance of the conventional spin valve 1 is low. When the magnetizations of the free layer 8 and the pinned layer 4 are antiparallel, the resistance of the conventional spin valve 1 is high. Similarly, when the magnetizations of the free layer 8' and pinned layer 4' are parallel, the resistance of the conventional spin tunneling junction 1' is low. When the magnetizations of the free layer 8' and pinned layer 4' are antiparallel, the resistance of is the conventional spin tunneling junction 1' is high.

In order to sense the resistance of the conventional magnetic element 1/1', current is driven through the conventional magnetic element 1/1'. Current can be driven through the conventional magnetic element 1 in one of two configurations, current in plane ("CIP") and current perpendicular to the plane ("CPP"). However, for the conventional spin tunneling junction 1', current is driven in the CPP configuration. In the CIP configuration, current is driven parallel to the layers of the conventional spin valve 1. Thus, in the CIP configuration, current is driven from left to right or right to left as seen in FIG. 1A. In the CPP configuration, current is driven perpendicular to the layers of conventional magnetic element 1/1'. Thus, in the CPP configuration, current is driven up or down as seen in FIG. 1A or 1B. The CPP configuration is used in MRAM having a conventional spin tunneling junction 1' in a memory cell.

FIG. 2 depicts a conventional memory array 10 using conventional memory cells 20. Each conventional memory cell 20 includes a conventional magnetic element 1/1', depicted as a resistor in FIG. 2. The conventional memory array 10 typically uses a spin tunneling junction 1'. The conventional array 10 is shown as including four conventional memory cells 20. Each memory cell 20 includes a conventional spin tunneling junction 1' and a transistor 22. The memory cells 20 are coupled to reading/writing column selection 30 via bit lines 32 and 34 and to row selection 50 via word lines 52 and 54. Also depicted are write lines 60 and 62 which carry currents that generate external magnetic fields for the corresponding conventional memory cells 20 during writing. The reading/writing column selection 30 is coupled to write current source 42 and read current source 40 which are coupled to a voltage supply Vdd 48 via line 46.

In order to write to the conventional memory array 10, the write current 1w 42 is applied to the bit line 32 or 34 selected by the reading/writing column selection 30. The read current Ir 40 is not applied. Both word lines 52 and 54 are disabled. The transistors 22 in all memory cells are disabled. In addition, one of the write lines 60 and 62 selected carries a current used to write to the selected conventional memory cell 20. The combination of the current in the write line 60 or 62 and the current in the bit line 32 or 34 generates a magnetic field large enough to switch the direction of magnetization of the free layer 8' and thus write to the desired conventional memory cell 20. Depending upon the data written to the conventional memory cell 20, the conventional magnetic tunneling junction 1' will have a high resistance or a low resistance.

In conventional MRAM, the net magnetic field generated by the currents in the write line 60 or 62 and the bit line 32 or 34 is oriented at an off-axis angle of $3\pi/4$ radians with respect to the easy axis of the free layer 8'. The easy axis of the free layer 8' is the direction in which the magnetization of the free layer 8' tends to reside in the absence of external fields. According to the "asteroid" switching threshold curve of the Stoner-Wohlfarth (SW) model for a single-domain magnet with uniaxial anisotropy, which has been confirmed experimentally many times, the total amount of applied current needed for switching is minimum when the off-axis orientation angle of the net generated magnetic field is $3\pi/4$ radians.

When reading from a conventional cell 20 in the conventional memory array 10, the read current Ir 40 is applied instead. The memory cell 20 selected to be read is determined by the row selection 50 and column selection 30. The output voltage is read at the output line 44.

Although the conventional magnetic memory 10 using the conventional spin tunneling junction 1' can function, one of ordinary skill in the art will readily recognize that there are barriers to the use of the conventional magnetic element 1' and the conventional magnetic memory 10 at higher memory cell densities. In particular, the conventional memory array 10 is written using an external magnetic field generated by currents driven through the bit line 32 or 34 and the write line 60 or 62. In other words, the magnetization of the free layer 8' is switched by the external magnetic field generated by current driven through the bit line 32 or 34 and the write line 60 or 62. The magnetic field required to switch the magnetization of the free layer 8', known as the switching field, is inversely proportional to the width of the conventional magnetic element 1'. As a result, the switching field increases for conventional memories having smaller magnetic elements 1'. Because the switching field is higher, the current required to be driven through the bit line 32 or 34 and particularly through the write line 60 or 62 increases dramatically for higher magnetic memory cell density. This large current can cause a host of problems in the conventional magnetic niemory 10. For example, cross talk and power consumption would increase. In addition, the driving circuits required to drive the current that generates the switching field at the desired memory cell 20 would also increase in area and complexity. Furthermore, the conventional write currents have to be large enough to switch a magnetic memory cell but not so large that the neighboring cells are inadvertently switched. This upper limit on the write current amplitude can lead to reliability issues because the cells that are harder to switch than others (due to fabrication and material nonuniformity) will fail to write consistently.

Accordingly, what is needed is a system and method for providing a magnetic memory element which can be used in a memory array of high density, low power consumption, lower current, low cross talk, high reliability, sufficient read signal, while providing a short write time. The present invention addresses the need for such a magnetic memory element.

SUMMARY OF THE INVENTION

The present invention provides a method and system for providing a magnetic element capable of being written using the spin-transfer effect while generating a high output signal and a magnetic memory using the magnetic element. The magnetic element comprises a first ferromagnetic pinned layer, a nonmagnetic intermediate layer, and a ferromagnetic free layer. The first pinned layer has a first magnetization pinned in a first direction. The nonmagnetic intermediate layer resides between the first pinned layer and the free layer. The free layer has a second magnetization with an easy axis in a second direction. The first direction is in the same plane as the second direction and is oriented at an angle with respect to the second direction. This angle is different from zero and π radians. The magnetic element is also configured to allow the second magnetization of the free layer to change direction due to spin transfer when a write current is passed through the magnetic element.

According to the system and method disclosed herein, the present invention provides a magnetic element and a magnetic memory that is capable of being written using the more efficient and localized spin-transfer mechanism while allowing for a shorter write time.

DETAILED DESCRIPTION OF THE INVENTION

The present invention relates to an improvement in magnetic elements and magnetic memories, such as MRAM. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Figure 1A:
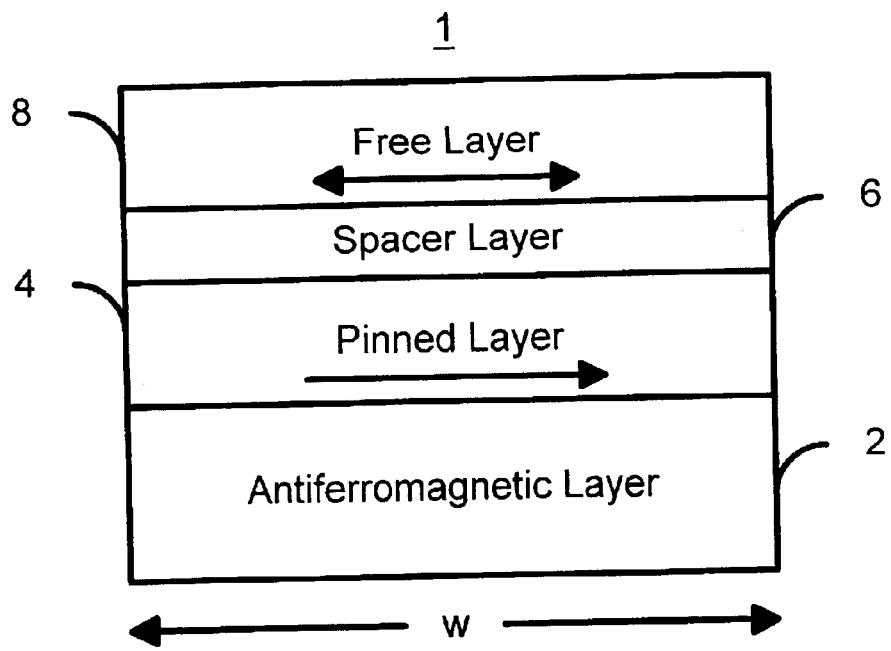
FIG. 1A is a diagram of a conventional magnetic element, a spin valve.
Figure 1B:
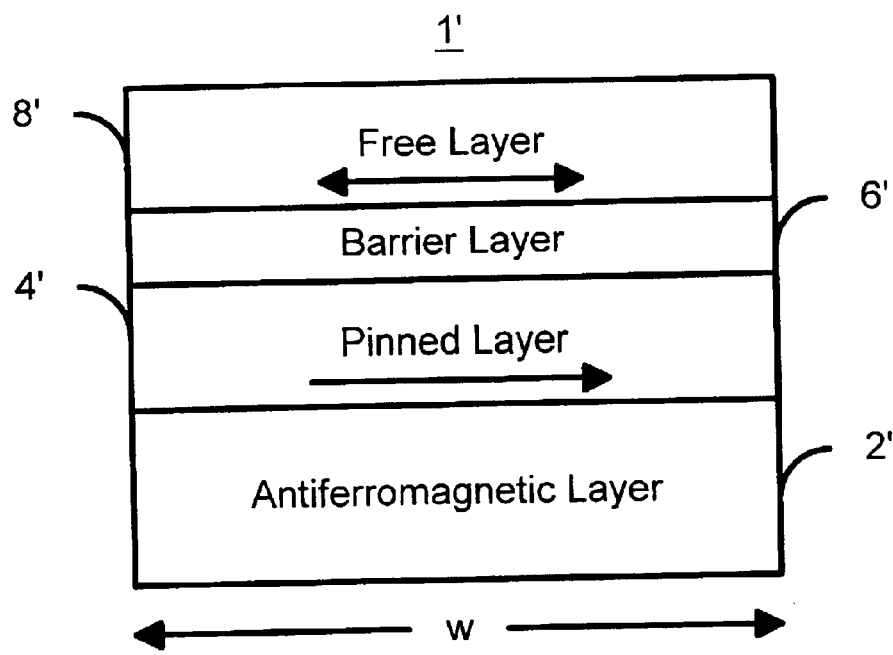
FIG. 1B is a diagram of a conventional magnetic element, a spin tunneling junction, such as an element used in a magnetic memory.
Figure 2:
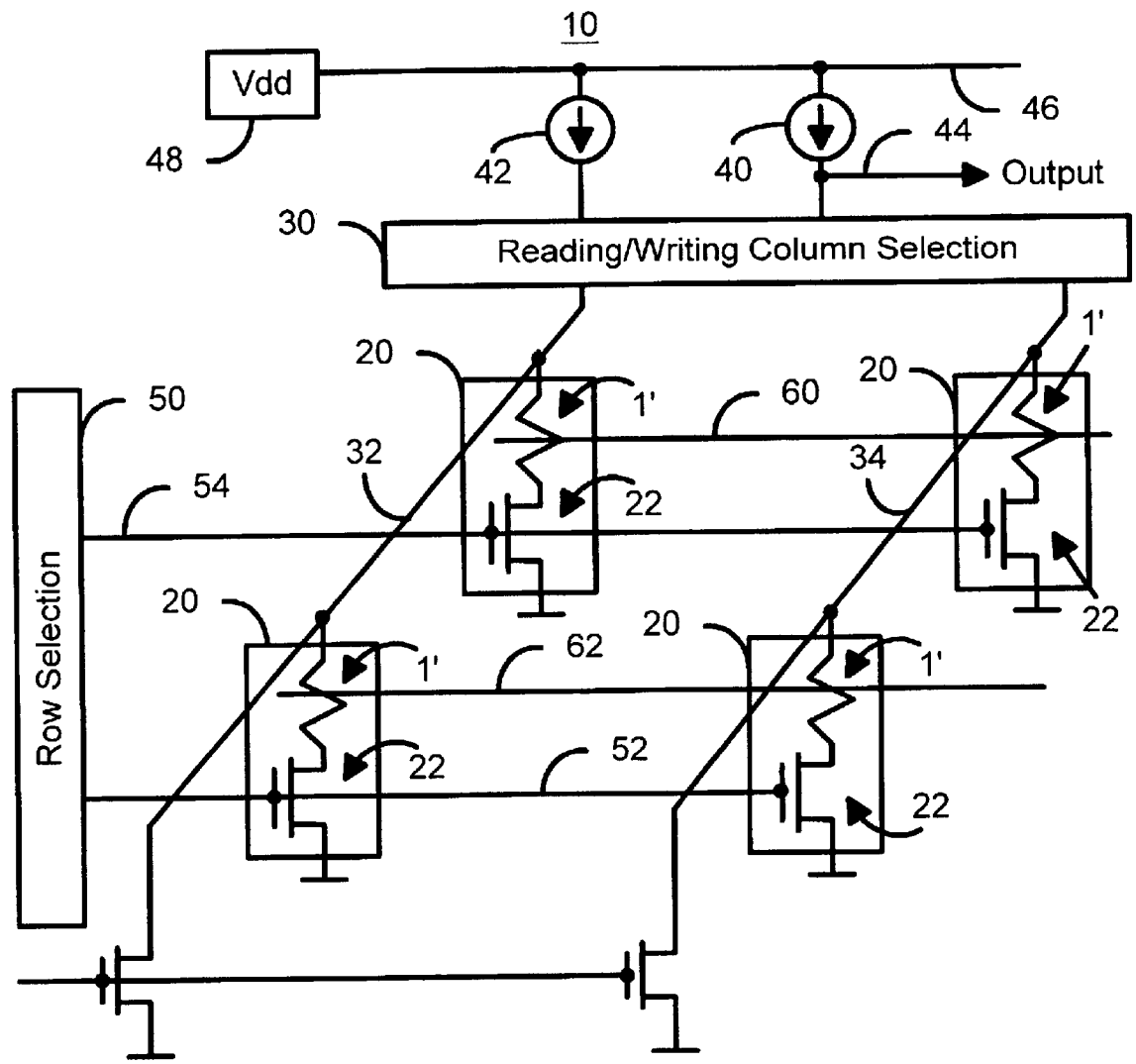
FIG. 2 is a diagram of a conventional magnetic memory array.

As described above, one of the challenges faced in increasing the density of conventional magnetic memories is the large current required to write to the conventional magnetic memories, such as the conventional magnetic memory 10 depicted in FIG. 2 and using the conventional magnetic elements 1' of FIG. 1B. In other words, the current required to generate the magnetic field that switches the direction of the magnetization of the free layer is large. This large current can be problematic because it can result in cross talk and high power consumption.

In order to overcome some of the issues associated with magnetic memories having a higher density of memory cells, a recently discovered phenomenon, spin transfer, may be utilized. Current knowledge of spin transfer is described in detail in J. C. Slonczewski, "Current-driven Excitation of Magnetic Multilayers," *Journal of Magnetism and Magnetic Materials*, vol. 159, p. L1–L5 (1996); L. Berger, "Emission of Spin Waves by a Magnetic Multilayer Traversed by a Current," *Phys. Rev. B*, Vol. 54, p. 9353 (1996), and in F. J. Albert, J. A. Katine and R. A. Buhman, "Spin-polarized Current Switching of a Co Thin Film Nanomagnet," *Appl Phys. Left.*, vol. 77, No. 23, p. 3809–3811 (2000). Thus, the following description of the spin transfer phenomenon is based upon current knowledge in the area and is not intended to limit the scope of the invention.

The spin-transfer effect arises from the spin-dependent electron transport properties of ferromagnetic-normal metal multilayers. When a spin-polarized current traverses a magnetic multiplayer in a CPP configuration, the spin angular momentum of electrons incident on a ferromagnetic layer interacts with magnetic moments of the ferromagnetic layer near the interface between the ferromagnetic and normal-metal layers. Through this interaction, the electrons transfer a portion of their angular momentum to the ferromagnetic layer. As a result, a spin-polarized current can switch the magnetization direction of the ferromagnetic layer if the current density is sufficiently high (approximately $10^7$–$10^8$ A/cm$^2$), and the ferromagnetic layer is sufficiently thin (preferably less than approximately ten nanometers for Co).

The phenomenon of spin transfer can be used in the CPP configuration as an alternative to or in addition to using an external switching field to switch the direction of magnetization of the free layer 8 or 8' of the conventional spin valve 1 or the conventional spin tunneling junction 1', respectively. Spin transfer is a phenomenon which dominates other mechanisms and thus becomes observable when the magnetic free layer's thickness is on the order of a few nanometers and the smaller of the two dimensions is in the range of few hundred nanometers. Consequently, spin transfer is suitable for higher density magnetic memories having smaller magnetic elements 1/1'.

For example, switching the magnetization of the conventional free layer 8 in the conventional spin valve 1 using spin transfer is described. Current can be driven from the conventional free layer 8 to the conventional pinned layer 4 to switch the magnetization of the conventional free layer 8 to be parallel to the magnetization of the conventional pinned layer 4. The magnetization of the conventional free layer 8 is assumed to be initially antiparallel to the conventional pinned layer 4. When current is driven from the conventional free layer 8 to the conventional pinned layer 4, conduction electrons travel from the conventional pinned layer 4 to the conventional free layer 8. The majority electrons traveling from the conventional pinned layer 4 have their spins polarized in the same direction as the magnetization of the conventional pinned layer 4. These electrons interact with the magnetic moments of the conventional free layer 8 near the interface between the conventional free layer 8 and the conventional spacer layer 6. As a result of this interaction, the electrons transfer their spin angular momentum to the conventional free layer 8. Thus, angular momentum corresponding to spins antiparallel to the magnetization of the conventional free layer 8 (and parallel to the conventional pinned layer 4) is transferred to the conventional free layer. If sufficient angular momentum is transferred by the electrons, the magnetization of the conventional free layer 8 can be switched to be parallel to the magnetization of the conventional free layer 4.

Alternatively, current can be driven from the conventional pinned layer 4 to the conventional free layer 8 to switch the magnetization of the conventional free layer 8 to be antiparallel to the magnetization of the conventional pinned layer 8. In this case the magnetization of the free layer 8 is assumed to be initially parallel to the pinned layer 4. When current is driven from the conventional pinned layer 4 to the conventional free layer 8, conduction electrons travel in the opposite direction. The majority electrons have their spins polarized in the direction of magnetization of the conventional free layer 8, which is originally magnetized in the same direction as the conventional pinned layer 4. These majority electrons are transmitted through the conventional pinned layer 4. However, the minority electrons, which have spins polarized antiparallel to the magnetization of the conventional free layer 8 and the conventional pinned layer 4, will be reflected from the conventional pinned layer 4 and travel back to the conventional free layer 8. The minority electrons reflected by the conventional pinned layer 4 interact with magnetic moments of the conventional free layer 8 and transfer at least a portion of their spin angular momentum to the conventional free layer 8. If sufficient angular momentum is transferred by the electrons to the conventional free layer 8, the magnetization of the free layer 8 can be switched to be antiparallel to the magnetization of the conventional pinned layer 4.

Using a current driven through the conventional magnetic elements 1 or 1' in the CPP configuration, spin transfer can switch the direction of magnetization of the free layer 8 or 8', respectively. Thus, spin transfer can be used to write to magnetic elements 1 or 1' in a magnetic memory by using a current through the conventional magnetic element 1 or 1'. The mechanism of spin-transfer writing is, therefore, more localized and generates less cross talk. Spin transfer is also more reliable because spin transfer results in a high effective field in the conventional magnetic elements 1/1' in a device such as MRAM. In addition, for a magnetic element 1 or 1' having a small enough size, the current required to switch the magnetization can be significantly less than the current required to generate a switching field in the conventional magnetic memory 10. Thus, there is less power consumption in writing.

Although the phenomenon of spin transfer can be used to switch the direction of the magnetization of the conventional free layer 8/8', one of ordinary skill in the art will readily recognize that there are additional barriers to using the conventional magnetic element 1/1' in a memory. For the conventional spin valve 1, the CPP configuration results in a significantly reduced signal. For example, the magnetoresistance ratio for the CPP configuration of the conventional spin valve 1 is only approximately two percent. In addition, the total resistance of the conventional spin valve 1 is low. Thus, the read signal output by the conventional spin valve 1 is very low. Although spin transfer can be used to write to a conventional spin valve 1, the output signal when reading from the conventional spin valve 1 is low enough to make it difficult to use the conventional spin valve 1 in a magnetic memory that is written using spin transfer.

On the other hand, a conventional spin tunneling junction 1' typically has a large resistance-area product, with Ra~kΩµm². A high current density is required to induce the spin-transfer effect could destroy thin insulating barrier due to ohmic dissipation. Moreover, the spin transfer has not been observed in the conventional spin tunneling junction 1' at room temperature. The conventional spin tunneling junction 1' having high Ra values may,. therefore, not be able to be used in MRAM using spin transfer to write to the magnetic memory cells. Consequently, one of ordinary skill in the art would recognize that a reliable, localized mechanism for writing to magnetic memories having higher densities and smaller magnetic elements is still desired.

The present invention provides a method and system for providing a magnetic element capable of being written with a reduced current using spin-transfer effect while generating a high output signal and a magnetic memory using the magnetic element. The magnetic element comprises a first ferromagnetic pinned layer, a nonmagnetic intermediate layer, and a ferromagnetic free layer. The first pinned layer has a first magnetization pinned in a first direction. The nonmagnetic intermediate layer resides between the first pinned layer and the free layer. The free layer has a second magnetization with an easy axis in a second direction. The first direction is in the same plane as the second direction and is oriented at an angle with respect to the second direction. This angle is different from zero and π radians. The magnetic element is also configured to allow the second magnetization of the free layer to change direction due to spin transfer when a write current is passed through the magnetic element.

The present invention will be described in terms of a particular magnetic memory and a particular magnetic element having certain components. However, one of ordinary skill in the art will readily recognize that this method and system will operate effectively for other magnetic memory elements having different and/or additional components and other magnetic memories having different and/or other features not inconsistent with the present invention. The present invention is also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. However, one of ordinary skill in the art will readily recognize that the method and system are consistent with other structures. For example, the preferred embodiment of the present invention is described in terms of a bottom spin valve (having a pinned layer at the bottom of the spin valve) combined with a top spin tunneling junction (having a pinned layer at the top of the spin tunneling junction). The present invention is also consistent with a top spin valve and a bottom spin tunneling junction. In addition, the method and system are described in the context of certain layers being synthetic. However, one of ordinary skill in the art will readily recognize that other and/or additional layers could be synthetic. Furthermore, the present invention is described in the context of particular methods having certain steps for performing certain functions, such as pinning the magnetization of the pinned layer in a particular direction. However, one of ordinary skill in the art will readily recognize that the present invention is also consistent with other methods for performing these functions. Finally, the present invention is described in terms of a particular structure having simple layers. However, one of ordinary skill in the art will readily recognize that the present invention is consistent with synthetic layers, such as synthetic pinned and/or free layers. In addition, for clarity, layers, such as seed and capping layers, may be omitted.

Figure 3A:
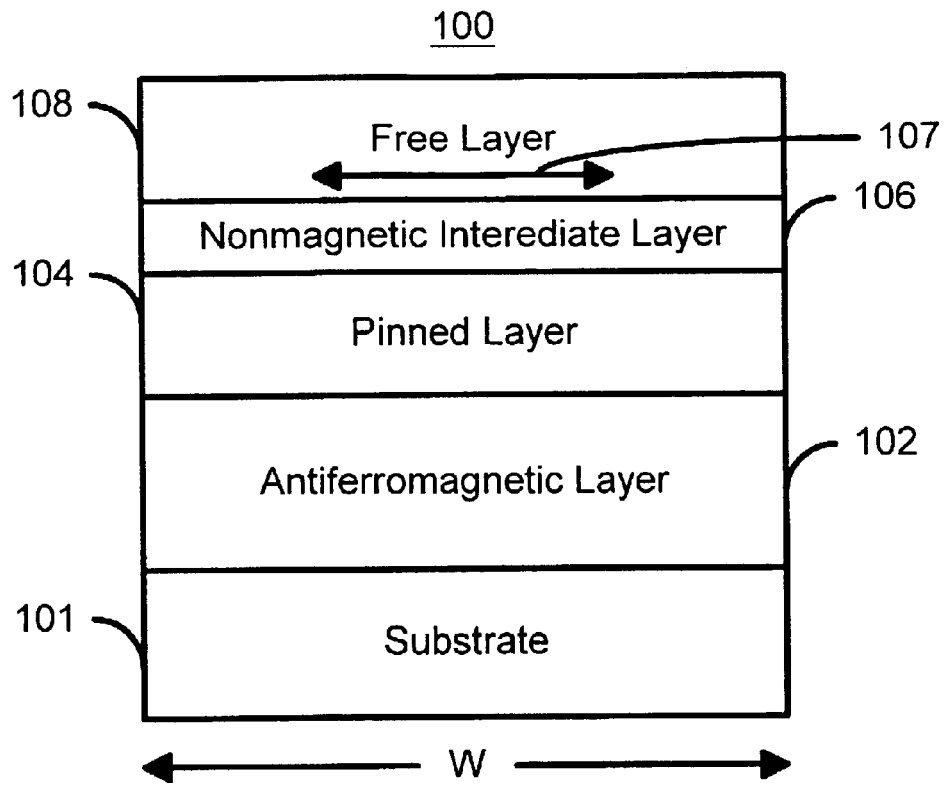
FIG. 3A is a diagram depicting one embodiment of a magnetic element in accordance with the present invention.
Figure 3B:
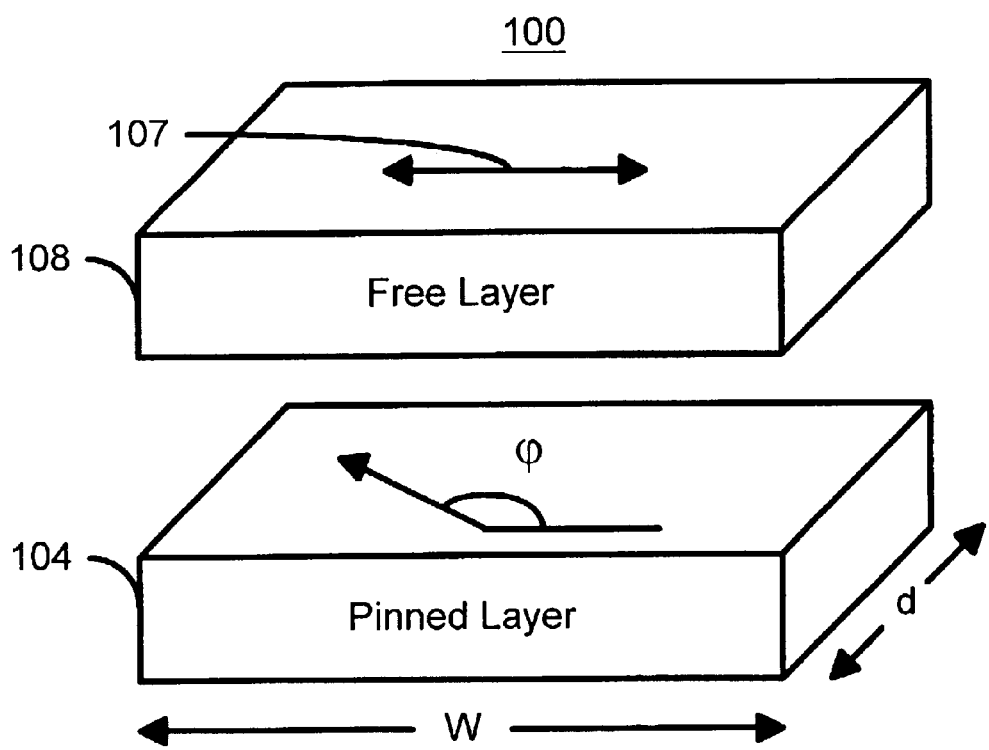
FIG. 3B is a diagram depicting the magnetization of one embodiment of the magnetic element in accordance with the present invention.

To more particularly illustrate the method and system in accordance with the present invention, refer now to FIGS. 3A and 3B, depicting one embodiment of a magnetic element 100 in accordance with the present invention. FIG. 3A is a side view depicting the layers of magnetic element 100. FIG. 3B depicts the magnetization of the magnetic element 100 in accordance with the present invention. The magnetic element 100 includes preferably includes a substrate 101, an antiferromagnetic layer 102, a pinned layer 104, a nonmagnetic intermediate layer 106 and a free layer 108. The pinned layers 104 and 112 as well as the free layer 108 preferably include Co, Fe, Ni and their alloys. The pinned layer 104 and free layer 108 are ferromagnetic. In addition, a seed layer (not shown), such as Ta or NiFeCr is preferably provided under the antiferromagnetic layer 102 to ensure that the antiferromagnetic layer 102 has the desired structure and properties. Note that the pinned layer 104 and the free layer 108 are depicted as single constituent ferromagnetic layers. However, one of ordinary skill in the art will readily recognize that any portion of the layers 104 and 108 can be synthetic.

The nonmagnetic intermediate layer 106 is, in one embodiment, an insulating barrier layer. In such an embodiment, the barrier layer 106 is thin enough to allow the tunneling of electrons through the barrier layer 106 and is preferably composed of alumina. The barrier layer 106 may include other dielectric materials including, but not limited to, AlN, $Ta_2O_5$. $SiO_2$, $HfO_2$, $ZrO_2$, MgO, $MgF_2$ and $CaF_2$. A barrier layer 106 may be used in order to increase the signal from the magnetic element 100. It is noted that currently spin-transfer switching has not been observed at room temperature in structures using a barrier layer. However, reductions in Ra to a few Ωµm² may allow the use of higher current, which can lead to spin-transfer switching in the magnetic element 100 using a barrier layer 106. In another embodiment, the nonmagnetic intermediate layer 106 may be a conductive spacer layer. In such an embodiment, the spacer layer 106 is preferably Cu or other nonmagnetic transition metal.

The magnetic element 100 is configured to allow the magnetization of the free layer 108 to be switched using spin transfer. Consequently, the dimensions of the magnetic element 100 are small, in the range of few hundred nanometers. In a preferred embodiment, the dimensions of the magnetic element 100 are less than two hundred nanometers and preferably approximately one hundred nanometers. The magnetic element 100 preferably has a depth, d, of approximately fifty nanometers. The depth is preferably smaller than the width of the magnetic element 100 so that the magnetic element 100 has some shape anisotropy, ensuring that the free layer 108 has a preferred direction. Depending on the magnetic material used, crystalline anisotropy can also be used together with the shape anisotropy to define the easy axis for the free layer 108. Thus the easy axis of the free layer is preferably in the direction shown in FIG. 3B. In addition, the thickness of the free layer 108 is low enough so that the spin-transfer effect can rotate the free layer magnetization into alignment with the magnetizations of the pinned layers 104 and 112. In a preferred embodiment, the free layer 108 has a thickness of less than or equal to 10 nm.

The magnetization of the free layer 108 preferably lies along the easy axis 107 of the free layer 108. The easy axis 107 of the free layer 108 preferably lies in the plane of the layers 102, 104, 106 and 108 of the magnetic element 100.

The magnetization of the pinned layer 104 is pinned in the direction shown in FIG. 3B. The antiferromagnetic layer 102 is preferably used to pin the magnetization of the pinned layer 104. The antiferromagnetic layer 102 may be composed of antiferromagnetic materials including, but not limited to, PtMn, NiMn, PdMn and IrMn. The magnetization of the pinned layer 104 is also pinned in the plane of the layers 102, 104, 106 and 108 of the magnetic element. However, the magnetization of the pinned layer 104 is pinned at an angle, ϕ, from the easy axis 107 of the free layer. Note that the angle, ϕ, is preferably not equal to zero or π radians because such an angle would place the magnetization of the pinned layer 104 along the easy axis 107 of the free layer 108. It is believed that the switching time will be reduced when the angle, ϕ, is other than zero or π. In one embodiment, the angle ϕ is 3π/4 radians. However, in an alternate embodiment, another value for the angle ϕ could be chosen.

In operation, the magnetic element 100 is written by using the spin-transfer effect. To write, the magnetization of the free layer 108 is switched from generally antiparallel to the direction of the magnetization of the pinned layer 104 to generally parallel to the direction of the magnetization of the pinned layer 104. In other words, the magnetization of the free layer 108 is switched from the right, as shown in FIG. 3B, to the left. In order to to switch the magnetization of the free layer 108 in this manner, a current is driven in a CPP configuration from the free layer 108 toward the pinned layer 104. Because electrons carry negative charges, such a current corresponds to conduction electrons traveling in the opposite direction, from the pinned layer 104 to the free layer 108. As the majority of the conduction electrons have their spins polarized in the direction of the magnetization of the pinned layer 104, they can rotate the magnetization of the free layer 108 into the same direction as the pinned layer 104. When the current is turned off, the new magnetization direction of the free layer 108 relaxes into the easy-axis direction of the free layer 108 closest to the direction of the magnetization of the pinned layer 104. The combination of the free layer-magnetization rotation to the (off-axis) pinned-layer-magnetization direction while the current is on, together with relaxation towards the closest easy-axis direction when the current is off constitutes a switching event.

Similarly, to write, the magnetization of the free layer 108 may also be switched from generally parallel to the direction of magnetization of the pinned layer 104 to the generally antiparallel to the direction of the magnetization of the pinned layer 104. In other words, the magnetization of the free layer 108 is switched from left in FIG. 3B to the right. In order to switch the magnetization of the free layer 108 in this manner, a current is driven in a CPP configuration from the pinned layer 104 to the free layer 108. This corresponds to conduction electrons traveling from the free layer 108 to the pinned layer 104. Although most of the majority conduction electrons pass through the free layer 108, most of the minority electrons get reflected because the minority electrons have their spins oriented a direction generally antiparallel to the magnetization of the free layer 108. The reflected minority electrons returning to the free layer 108 can switch the magnetization of free layer 108 with a combination of rotation and relaxation as described above.

Thus spin transfer can be used to write to magnetic element 100. As a result, a switching field driven by an external current is unnecessary. Instead, the more localized and reliable spin-transfer mechanism is used to write to the magnetic element 100. For a magnetic element 100 having the preferred dimensions, a sufficient current density on the order of $10^7$ Amps/cm$^2$ can be provided at a relatively small current. For example, a current density of approximately $10^7$ Armps/cm$^2$ can be provided with a current of approximately 0.5 mA for a magnetic element having an ellipsoidal shape of 0.06×0.12 μm$^2$. The time required to switch the magnetization of the free layer 108 is reduced when the magnetization of the pinned layer 104 is oriented at an off-axis angle, ϕ, with respect to the easy axis 107 of the free layer 108. The switching time may, therefore, be reduced when the angle, ϕ, is other than zero or π. For example, when the angle ϕ is 3π/4 radians, the switching time may be reduced.

In order to read from the magnetic element 100, current is also driven through the layers of the magnetic element 100 in the CPP configuration. However, the magnitude of the current used in reading the magnetic element 100 is less than the current used to write to the magnetic element 100. When the magnetization of the free layer 108 is generally in the direction of the magnetization of the pinned layer 104 (to the left in FIGS. 3A and 3B), the magnetic element 100 has a lower resistance. When the magnetization of the free layer is generally antiparallel to the magnetization of the pinned layer 104 (to the right in FIGS. 3A and 3B), the magnetic element 100 has a higher resistance. In addition, because the magnetization ol the pinned layer 104 is fixed at the angle, ϕ, with respect to the easy axis 107 of the free layer 108, the read signal is reduced by a factor of |cos ϕ| when the magnetizations of the free layer 108 and pinned layer 106 arc at an angle of ϕ with respect to each other. However, with appropriate read circuitry (not shown in FIGS. 3A and 3B), such a reduction of the signal should be acceptable.

Thus, the magnetic element 100 can be written by exploiting the spin-transfer phenomenon. Because spin transfer is used, an external current producing an external switching magnetic field is no longer needed to write to the free layer 108 of the magnetic element 100. Instead, a current driven through the magnetic element 100 is used. As a result, there is less cross talk because a more localized switching mechanism is utilized, and less power consumed. In addition, spin transfer has been found to be a more reliable switching mechanism than an external switching field. Spin transfer generates a very high effective field and can thus switch a greater percentage of magnetic elements 100 in a memory. Lastly, for a magnetic element having the preferred size, the current required to write to the magnetic element 100 may be reduced. The time required to write to the magnetic clement 100 is further reduced because the magnetization of the pinned layer 104 is oriented at an angle, ϕ, off-axis from the easy axis 107 of the free layer 108. Consequently, the magnetic element 100 is suitable for use as a storage element in a higher density magnetic memory such as MRAM.

Figure 4A:
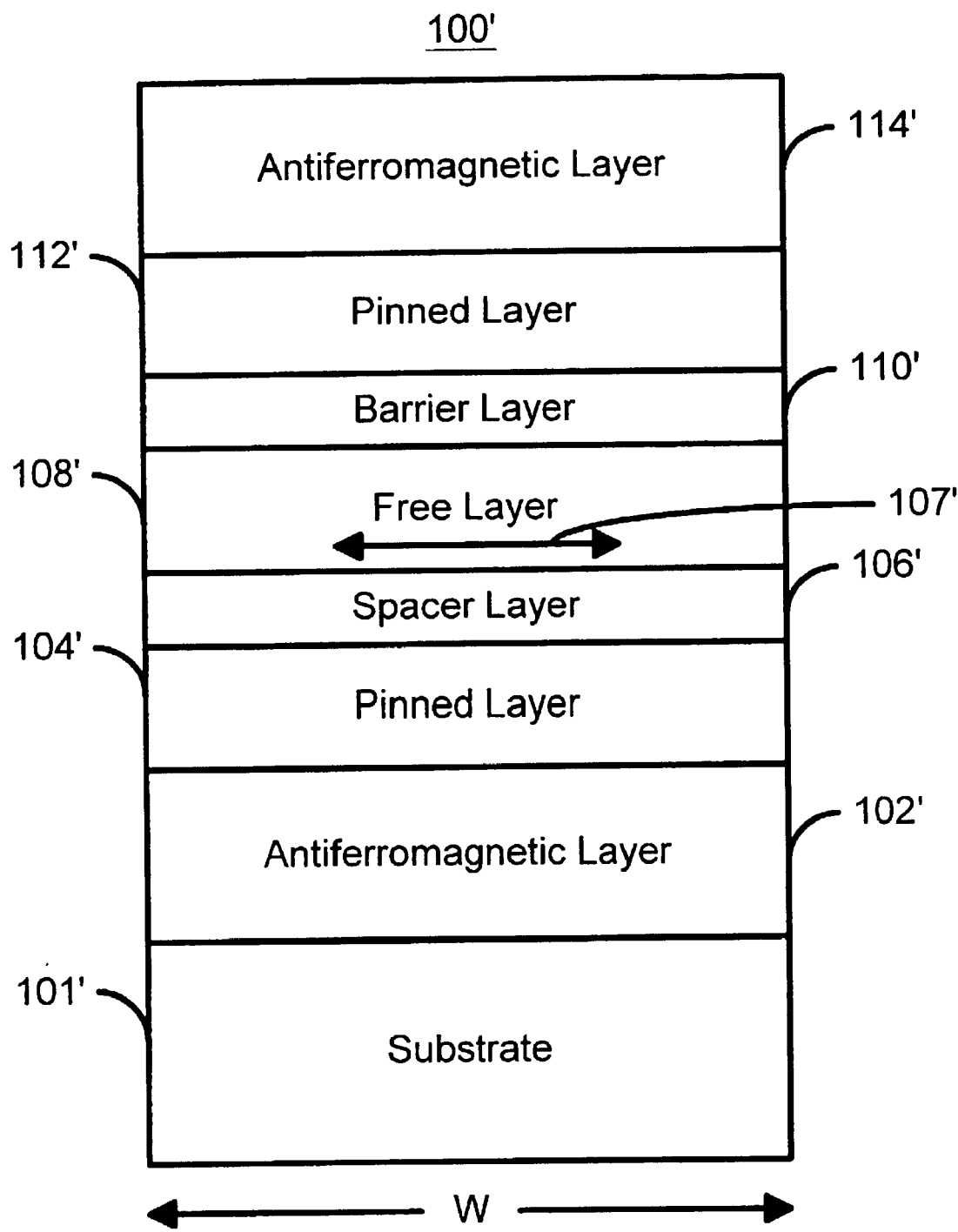
FIG. 4A is a diagram depicting a preferred embodiment of a magnetic element in accordance with the present invention.
Figure 4B:
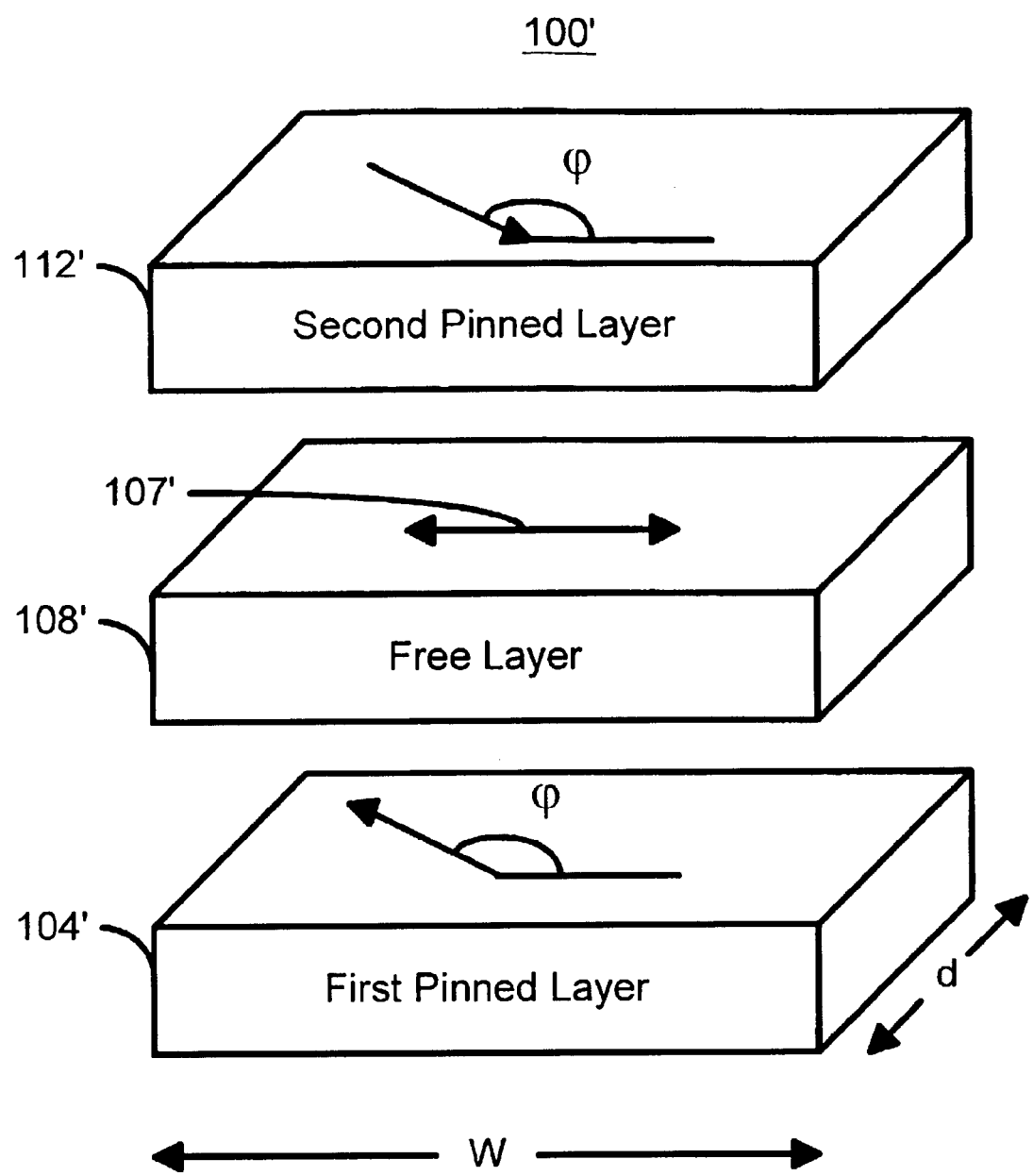
FIG. 4B is a diagram depicting the magnetization of the preferred embodiment of a magnetic element in accordance with the present invention.

FIGS. 4A and 4B depict a preferred embodiment of a magnetic element 100' in accordance with the present invention. FIG. 4A shows the magnetic element 100 from the side. FIG. 4B depicts the magnetizations of the magnetic element 100'. The magnetic element 100' is formed on a substrate 101'. The magnetic element 100' includes a first antiferromagnetic layer 102', a first pinned layer 104', a conductive spacer layer 106', a free layer 108', an insulating barrier layer 110', a second pinned layer 112' and a second antiferromagnetic layer 114'. Note that the first pinned layer 104', the free layer 108' and the second pinned layer 112' are depicted as single constituent ferromagnetic layers. However, one of ordinary skill in the art will readily recognize that any portion of the layers 104', 108' and 112' can be synthetic. The magnetic clement 100' can be considered to be a combination of a spin valve and a spin tunneling junction. The spin valve would be considered to include the first antiferromagnetic layer 102', the first pinned layer 104', the conductive spacer layer 106', and the free layer 108'. The spin tunneling-junction would be considered to include the free layer 108', the insulating barrier layer 110', the second pinned layer 112' and the second antiferromagnetic layer 114'. In the preferred embodiment, the spin valve portion of the magnetic element 100' writes to the free layer 108' using spin transfer, while the spin tunneling portion of the magnetic element 100' is used to read the magnetic element 100'.

The magnetic element 100' is configured to allow the magnetization of the free layer 108' to be switched using spin transfer. Consequently, the dimensions of the magnetic element 100' are small, in the range of few hundred nanometers. In a preferred embodiment, the width of the magnetic element 100' is less than two hundred nanometers and preferably approximately one hundred nanometers. The magnetic element 100' preferably has a depth, d, of approximately fifty nanometers. The depth is preferably smaller than the width of the magnetic element 100' so that the magnetic element 100' has some shape anisotropy, ensuring that the easy axis 107' of the free layer 108' has a particular direction. Depending on the magnetic material used, crystalline anisotropy can also be used together with the shape anisotropy to define the easy axis for the free layer 108. In addition, the thickness of the free layer 108' is low enough so that the spin-transfer effect can rotate the free layer magnetization into alignment with the magnetizations of the pinned layers 104' and 112'. In a preferred embodiment, the free layer 108' has a thickness of less than or equal to 10 nm.

The magnetization of the free layer 108' preferably lies along the easy axis 107' of the free layer 108'. The easy axis 107' of the free layer 108' preferably lies in the plane of the layers 102', 104', 106', 108', 110', 112' and 114' of the magnetic element 100'. The magnetizations of the pinned layers 104' and 112' are pinned in the directions shown in FIG. 4B. The antiferromagnetic layers 102' and 114' are preferably used to pin the magnetizations of the pinned layers 104' and 112'. The magnetizations of the pinned layers 104' and 112' are also pinned intheplane of the layers 102', 104', 106', 108', 110', 112' and 114' of the magnetic element 100'. However, the magnetizations of the pinned layers 104' and 112' are pinned at an angle $\phi$ from the easy axis 107' of the free layer (or pinned at $\phi$ and $_{\pi-\phi}$ for the pinned layers 104' and 112' if the angle are measured in the same direction from the same axis for both layers). Note that the angle, $\phi$, is preferably not equal to zero or $\pi$ radians because such an angle would place the magnetizations of the pinned layers 104' and 112' along the easy axis 107' of the free layer 108'. For example, in one embodiment, the angle $\phi$ is $3\pi/4$ radians. It is believed that the switching time will be reduced when the angle, $\phi$, is other than zero or $\pi$. Thus, in an alternate embodiment, any value for the angle $\phi$ other than zero or $\pi$ could be chosen.

The magnetizations of the first pinned layer 104' and the second pinned layer 112' are also depicted as being pinned in opposite directions. In an alternate embodiment, the magnetizations of the pinned layers 104' and 112' may be pinned in the same direction. For example, if a synthetic free layer is used, the pinned layers 104' and 112' are preferably pinned in the same direction. However, in an embodiment which may not function as well as the preferred embodiment, the pinned layers 104' and 112' may still be pinned in the same direction when a simple free layer is used. Thus, in a preferred embodiment, the pinned layers 104' and 112' adjacent to the spacer layer 106' and the barrier layer 110', respectively, are desired to be aligned in opposite directions. This orientation is desired so that if the spin tunneling junction portion of the magnetic element 100' can be made to contribute to spin transfer, its contribution then would work together with, not against, the contribution from the spin valve portion to switch the free layer's magnetization.

The antiferromagnetic layers 102' and 114' are used to pin the magnetizations of the pinned layers 104' and 112', respectively. The antiferromagnetic layers 102' and 114' are preferably composed of PtMn. However, nothing prevents the antiferromagnetic layers 102' and 114' from including other antiferromagnetic materials, such as NiMn, PdMn and IrMn. PtMn is preferred for use in the antiferromagnetic layers 102' and 114' because PtMn has a high blocking temperature and a high exchange biasing field, which improve the thermal stability of the magnetic element 100'. In such an embodiment, the orientation of the antiferromagnetic layers can be set by annealing the magnetic element 100' in a field of at least five thousand Oersted at approximately two hundred and seventy degrees Celsius for between three and ten hours. Antiferromagnetic layers 102' and 114' having different blocking temperatures are preferably used when the pinned layers 104' and 112' are to be pinned in different directions. When the antiferromagnetic layer 102' has a higher blocking temperature than the antiferromagnetic layer 114', the orientation of the antiferromagnetic layer 114' can be set independently from the antiferromagnetic layer 102' by annealing the magnetic element 100' at the blocking temperature of the antiferromagnetic layer 114'. As a result, the magnetizations of the pinned layers 102' and 114' can be pinned in different directions.

The pinned layers 104' and 112' as well as the free layer 108' preferably include Co, Fe, Ni and their alloys. Also in a preferred embodiment, the thicknesses of the ferromagnetic layer 104', 108' and 112' are selected to balance the interaction and demagnetization fields of the ferromagnetic layers so that the free layer 108' does not experience a strong net bias. In other words, the dipolar, interlayer, and static coupling fields preferably sum to zero to reduce the bias on the free layer 108'. Moreover, as discussed above, the magnetic element preferably has some shape and/or crystalline anisotropy so that the free layer 108' has the easy axis 107'. In addition, a seed layer (not shown), such as Ta or NiFeCr is preferably provided under the antiferromagnetic layer 102' to ensure that the antiferromagnetic layer 102' has the desired structure and properties. The conductive spacer layer 106' is preferably Cu or other nonmagnetic transition metal. The barrier layer 110' is thin enough to allow the tunneling of electrons through the barrier layer 110' and is preferably composed of alumina. In alternate embodiments, the barrier layer 110' may include other dielectric materials including, but not limited to, AlN, $Ta_2O_5$, $SiO_2$, $HfO_2$, $ZrO_2$, MgO, $MgF_2$ and $CaF_2$.

In operation, the magnetic element 100' is written by using spin transfer. Currently, the spin transfer phenomenon is predominantly provided using the spin valve portion of the magnetic element 100'. To write, the magnetization of the free layer 108' is switched from generally antiparallel to the direction of magnetization of the first pinned layer 104' to generally parallel direction of the magnetization of the first pinned layer 104'. In other words, the magnetization of the free layer 108' is switched from the right to the left, as shown in FIG. 4B. To switch the direction of magnetization of the free layer 108' in this manner, a current is driven in a CPP configuration from the free layer 108' toward the pinned layer 104'. Because electrons carry negative charges, such a current corresponds to conduction electrons traveling in the opposite direction, from the pinned layer 104' to the free layer 108'. As the majority of the conduction electrons have their spins polarized in the direction of the magnetization of the pinned layer 104', they can rotate the magnetization of the free layer 108' into the same off-axis direction as the pinned layer 104'. When the current is turned off, the new magnetization direction of the free layer 108' relaxes into the easy-axis direction of the free layer 108' closest to the direction of the magnetization of the pinned layer 104' (e.g. to the left as shown in FIG. 3B). The combination of the free-layer magnetization rotation to the off-axis pinned-layer magnetization direction while the current is on, together with relaxation towards the closest easy-axis direction when the current is off constitutes a switching event.

Similarly, the magnetization of the free layer 108' may also be switched from generally parallel to the direction of magnetization of the pinned layer 104' to generally antiparallel to the direction of the magnetization of the pinned layer 104'. Thus, the magnetization of the free layer 108' is switched from the left to the right as shown in FIG. 3B. To switch the magnetization in this manner, acurrent is driven in a CPP configuration from the pinned layer 104' to the free layer 108'. This corresponds to conduction electrons traveling from the free layer 108' to the pinned layer 104'. Although most of the majority electrons pass through the free layer 108', most of the minority electrons get reflected because the minority electrons have their spins oriented in the direction generally antiparallel to the magnetization of the free layer 108'. The reflected conduction minority electrons returning to the free layer 108' can switch the magnetization of free layer 108' with a combination of rotation and relaxation as described above.

Thus spin transfer can be used to write to magnetic element 100'. As a result, a switching field driven by an external current is unnecessary. Instead, the more localized and reliable spin-transfer mechanism is used to write to the magnetic element 100'. For a magnetic element 100' having the preferred dimensions, a sufficient current density on the order of $10^7$ Amps/cm$^2$ can be provided at a relatively small current. For example, a current density of approximately $10^7$ Amps/cm$^2$ can be provided with a current of approximately 0.5 mA for a magnetic element having an ellipsoidal shape of 0.06×0.12 $\mu$m$^2$. Furthermore, pinning the magnetizations of the pinned layers 104' and 112' off axis from the easy axis 107' of the free layer 108' reduces the time required to switch the direction of magnetization of the free layer 108'. For example, the switching time may be reduced when the angle, $\phi$, is $3\pi/4$ radians.

Additional advances in spin tunneling junctions with low Ra of a few $\Omega$ $\mu$m$^2$ may allow the spin tunneling junction portion (108', 110', 112' and 114') of the magnetic element 100' to contribute to the spin transfer because the electron spin is conserved during tunneling. Consequently, in a preferred embodiment, the magnetizations of the pinned layers 104' and 112' are in opposite directions so that the spin tunneling junction portion of the magnetic element 100' has an opportunity to appropriately contribute to the spin transfer. In such an embodiment, the spin transfer due to conduction electrons traveling from the pinned layer 104' to the free layer 108' and conduction electrons reflected off the pinned layer 112' and returning to the free layer 108' would generally work together to align the magnetization of the free layer 108' in the direction of magnetization of the pinned layer 104'. Similarly, spin transfer due to conduction electrons traveling from the pinned layer 112' to the free layer 108' and conduction electrons reflected off the pinned layer 104' and returning to the free layer 108' would work together to align the magnetization of the free layer 108' in the direction of magnetization of the pinned layer 112'. Because the magnetizations of the pinned layers 104' and 112' are pinned in opposite directions, in such an embodiment using advances in spin tunneling junctions would improve the ability of the magnetic element 100' to be written using spin transfer. In such an embodiment, the current required to switch the direction of magnetization of the free layer 108' may be further reduced, for example by a factor of two.

During reading, the properties of the spin tunneling junction portion of the magnetic element 100' are preferably exploited. Because of the existence of the insulating barrier 110' and the second pinned layer 112', the spin tunneling portion of the magnetic element 100' dominates the output signal. In other words, although writing to the magnetic element 100' sets the magnetization of the free layer 108' with respect to the first pinned layer 104', the magnetization of the free layer 108' with respect to the second pinned layer 110' dominates the output signal of the magnetic element, both in total resistance and in magnetoresistance changes. Thus, during reading, the state of the free layer 108' with respect to the second pinned layer 112' (generally antiparallel or parallel to the second pinned layer 112') determines the output of the magnetic element 100'. When the free layer 108' is generally parallel to the second pinned layer 112' (to the right in FIGS. 4A and 4B), the resistance of the magnetic element 100' is low. When the free layer 108' is generally antiparallel to the second pinned layer 112' (to the left in FIGS. 4A and 4B), the resistance of the magnetic element 100' is high. Ra for the magnetic element 100' is preferably on the order of few $\Omega$ $\mu$m$^2$. As a result, a higher current density, on the order of $10^7$ Amps/cm$^2$, can be provided without destroying the magnetic element 100'. Moreover, because the magnetoresistance due to the spin tunneling junction portion of the magnetic element 100' is much larger than (preferably at least twenty times) that from spin-valve portion in the CPP configuration, the magnetic element 100' provides a sufficient signal at lower current densities in the CPP configuration. This is true even when the read signal is reduced by a factor of $|\cos \phi|$ due to the off-axis alignment of the magnetizations of the pinned layers 104' and 112'.

The read signal may be decreased by the factor of $|\cos \phi|$ when both pinned layers 104' and 112' are oriented at an angle of $\phi$ from the easy axis, as shown in FIGS. 4A and 4B. This reduction in the read signal can be basically eliminated by reorienting the magnetization of the pinned layer 112' back to an on-axis alignment while keeping the magnetization of the pinned layer 104' off-axis. In such an embodiment, the switching time is still reduced because of the off-axis orientation of the magnetization of the pinned layer 104' with respect to the easy axis 107'. However, because the magnetization of the pinned layer 112' is along the easy axis 107' (on-axis), the read signal from the spin tunneling junction portion of the magnetic element 100' is not diminished.

The magnetic element 100' can thus be written to and read from using a current driven through the magnetic element 100'. TIhe read current driven through the magnetic element 100' is less than the current driven through the magnetic element 100' during writing. The read current is less than the write current in order to ensure that the direction of magnetization of the free layer 108' of the magnetic element 100' is not inadvertently switched to during reading. In a preferred embodiment, the read current is an order of magnitude less than the write current.

Thus, the magnetic element 100' can be written by exploiting the spin-transfer phenomenon. Because spin transfer is used, an external current producing an external switching magnetic field is no longer needed to write to the free layer 108' of the magnetic element 100'. Instead, a current driven through the magnetic element 100' is used. As a result, there is less cross talk because a more localized switching mechanism is utilized, and less power consumed. In addition, spin transfer has been found to be a more reliable switching mechanism than an external switching field. Spin transfer generates a very high effective field and can thus switch a greater percentage of magnetic elements 100' in a memory. Furthermore, for a magnetic element having the preferred size, the current required to write to the magnetic element 100' may be reduced. The switching time can be reduced because of the off-axis orientations of the magnetization of the pinned layers 104' and 112' with respect to the easy axis 107' of the free layer 108'. The magnetic element 100' also has a significantly higher output signal when being read in a CPP configuration than a conventional spin valve because of the presence of the spin tunneling junction portions (layers 108', 110', 112' and 114') of the magnetic element 100'. Consequently, the magnetic element 100' is suitable for use as a storage element in a higher density magnetic memory such as MRAM.

Figure 5A:
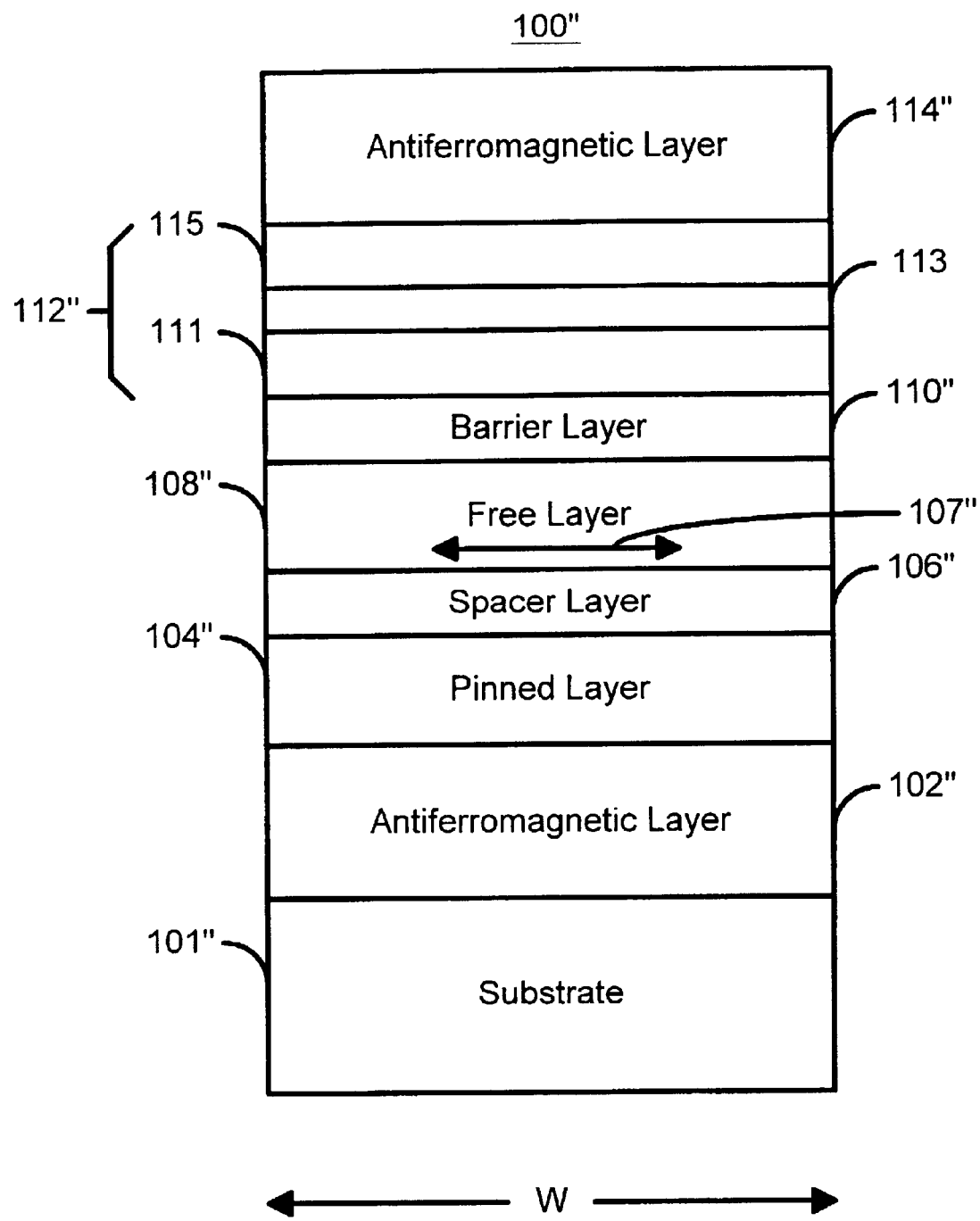
FIG. 5A is a diagram depicting another, preferred embodiment of a magnetic element in accordance with the present invention.
Figure 5B:
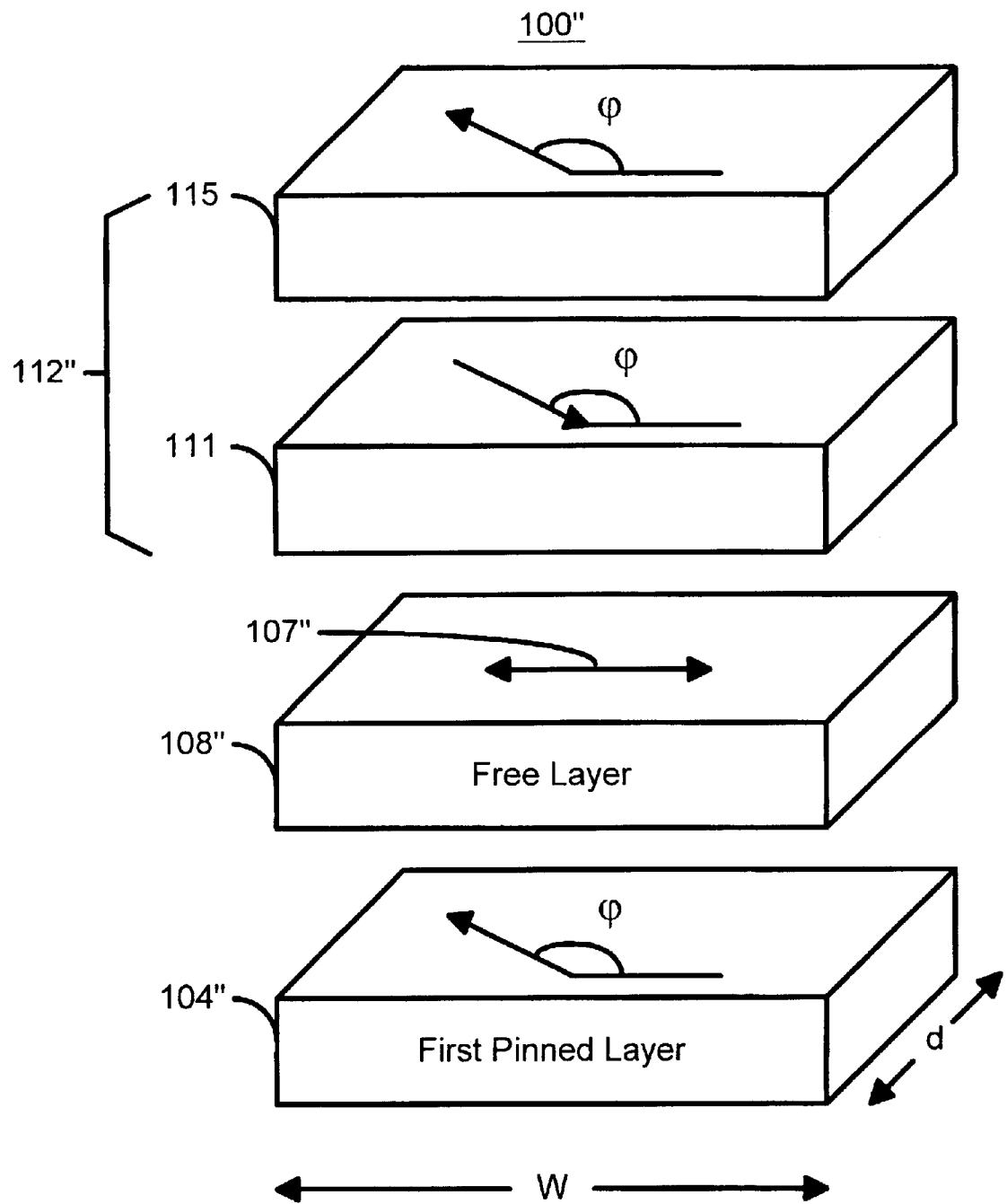
FIG. 5B is a diagram depicting the magnetization of the other preferred embodiment of a magnetic element in accordance with the present invention.

FIGS. 5A and 5B are diagrams depicting another, preferred embodiment of a magnetic element 100" in accordance with the present invention. FIG. 5A depicts the magnetic element 100" from the side. FIG. 5B depicts the magnetization of the magnetic element 100". The magnetic element 100" has many of the same components as the magnetic clement 100' depicted in FIGS. 4A and 4B. Consequently, analogous structures are labeled similarly for the magnetic element 100" depicted in FIGS. 5A and 5B. In addition, these components are preferably fabricated in an analogous manner and made from similar materials as analogous components in the magnetic clement 100'. However, the second pinned layer 112" of the magnetic clement 100" is a synthetic pinned layer 112". Thus, the synthetic pinned layer 112" includes ferromagnetic layers 111 and 115 separated by a nonmagnetic conductive spacer layer 113. The magnetic layers 111 and 115 preferably include Co, Fe, Ni and their fcrromagnetic alloys, such as NiFe, CoFe or CoNiFe. In addition, the above materials containing some B impurities may also be used for the magnetic layers 111 and 115. The B impurities give the materials greater thermal stability. In alternate embodiments, the layers 111 and 115 may be made of other magnetic materials such as half metallic ferromagnets including $CrO_2$, $Fe_3O_4$, NiMnSb and PtMnSb. The nonmagnetic spacer layer 113 preferably includes materials such as Ru, Ir and Re. The thickness of the nonmagnetic spacer layer is such that the ferromagnetic layers 111 and 115 are antiferromagnetically coupled.

The synthetic pinned layer 112" is preferred to simplify the annealing process which sets the pinning directions of the magnetizations of the second pinned layer 112" and the first pinned layer 104". In particular, use of the synthetic pinned layer 112" allows the antiferromagnetic layers 102" and 114" to be made from the same material, preferably PtMn, and aligned in the same direction. The antiferromagnetic layers 102" and 114" may thus be aligned together in the same step. Consequently, the magnetizations of the first pinned layer 104" and the ferromagnetic layer 115 are pinned in the same direction. The magnetization of the ferromagnetic layer 111 is in the opposite direction as the magnetization of the ferromagnetic layer 115 and the pinned layer 104". As a result, the desired directions of the magnetizations of the ferromagnetic layers 104" and 111 adjacent to the spacer layer 106" and barrier layer 110", respectively, are more easily established.

The read signal may be decreased by the factor of $|\cos \phi|$ when both pinned layers 104" and 112" are oriented at an angle of $\phi$ from the easy axis, as shown in FIGS. 5A and 5B. This reduction in the read signal can be reduced or basically eliminated by reorienting the magnetization of the pinned layer 112" back to an on-axis alignment while keeping the magnetization of the pinned layer 104" off-axis. In such an embodiment, the switching time is still reduced because of the off-axis orientation of the magnetization of the pinned layer 104' with respect to the easy axis 107". However, because the magnetization of the pinned layer 112" is along the easy axis 107" (on-axis), the read signal from the spin tunneling junction portion of the magnetic element 100" is not diminished. These orientations may be achieved using a variety of techniques, including the spin flop phenomenon [J. G. Zhu, IEEE Tans. Magn. Vol. 35, p. 655 (1999)].

The magnetic element 100" can also be written by exploiting the spin-transfer phenomenon. Because spin transfer is used, an external current producing an external switching magnetic field is no longer needed to write to the free layer 108' of the magnetic element 100'. The spin-transfer mechanism used in switching the magnetization of the free layer 108" is more localized and more reliable. Further, for a magnetic element 100" having the preferred size, the current required to write to the magnetic element 100" may be greatly reduced over the current used in writing to the conventional magnetic element 1' in a high density memory. In addition, setting the pinning directions of the magnetic element 100' is simplified due to the presence of the synthetic pinned layer 112", which allows the use of the same antiferromagnetic materials such as PtMn for both pinned layers 104" and 112". The use of PtMn antiferromagnetic materials greatly improves the thermal stability of the magnetic clement 100". Furthermore, the magnetic element 100 has a significantly higher output signal when being read in a CPP configuration than a conventional spin valve because of the presence of the spin tunneling junction portion (layers 108", 110", 112" and 114") of the magnetic element 100". Consequently, the magnetic element 100" is suitable for use as a storage element in a higher density magnetic memory such as MRAM.

Figure 6:
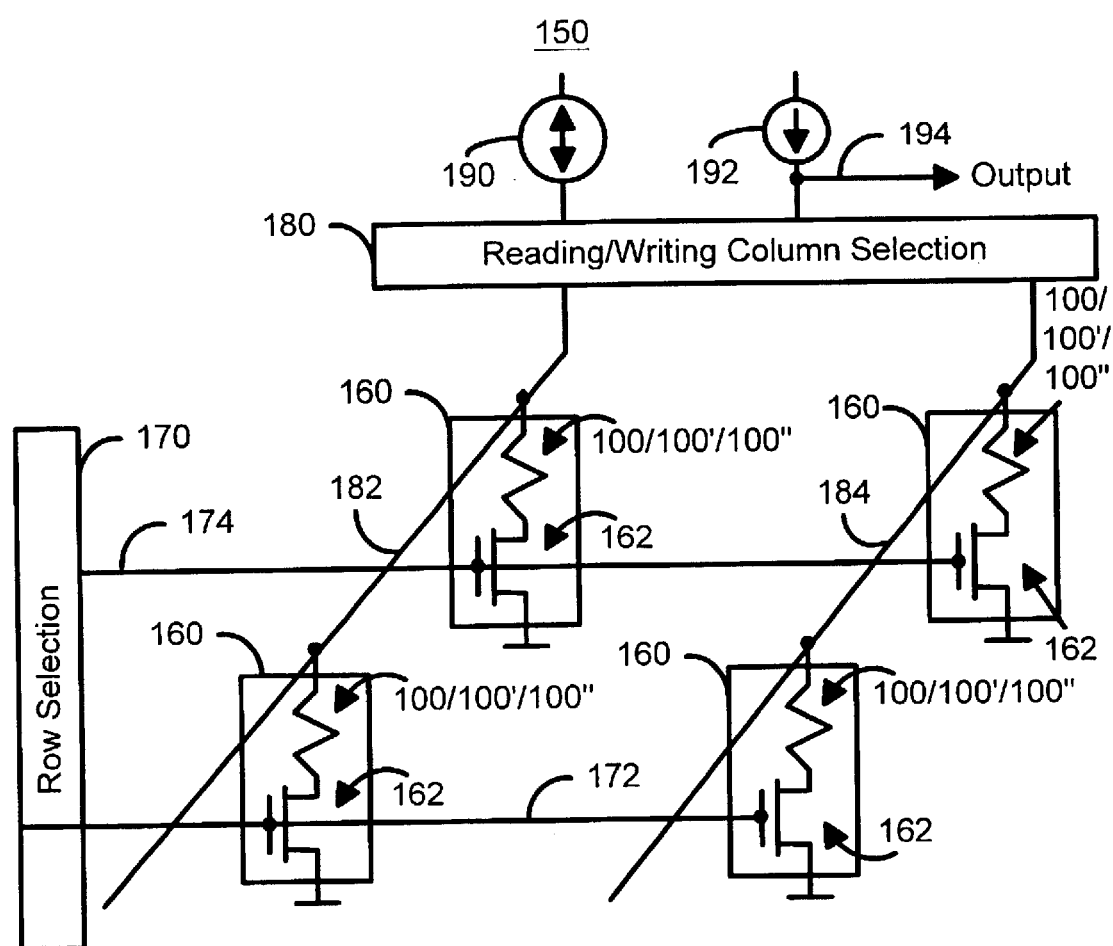
FIG. 6 is a diagram depicting one embodiment of a magnetic memory in accordance with the present invention using the magnetic element in accordance with the present invention.

FIG. 6 is a diagram depicting one embodiment of a magnetic memory array 150 in accordance with the present invention using the magnetic element 100, 100' or 100" in accordance with the present invention. The magnetic memory array 150 is for exemplary purposes only and thus depicts a memory array 150 in which the magnetic elements 100, 100' or 100" may be more directly incorporated into a conventional memory. Thus, each memory cell 160 includes a magnetic element 100, 100', or 100" and a transistor 162. The magnetic memory array 150 also includes row selection mechanism 170, column sclcction mechanism 180, word lines 172 and 174, and bit lines 182 and 184. The magnetic memory array 150 further includes write current source 190 and read current source 192. However, the magnetic memory array 150 does not include any write lines.

Because spin transfer is used to write to the magnetic elements 100, 100' and 100", additional lines, such as write lines 60 and 62 of the conventional memory 10, depicted in FIG. 2, are unnecessary. The density ol the magnetic memory 150 may be further increased without high power consumption and other issues due to the use of the conventional write operation to write the conventional memory elements 1 and 1'. In addition, the, fabrication process and the circuitry used to write to the magnetic elements 100, 100' and 100" can be simplified because of the omission of separate write lines.

Figure 7:
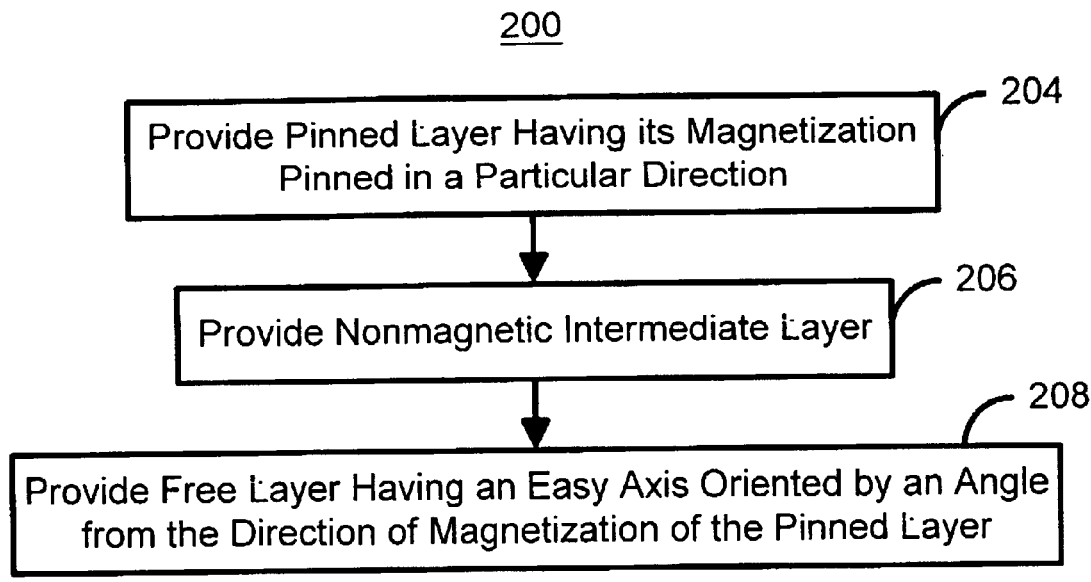
FIG. 7 is a high-level flow chart depicting one embodiment of a method in accordance with the present invention for providing a magnetic element in accordance with the present invention.

FIG. 7 is a high-level flow chart depicting one embodiment of a method 200 in accordance with the present invention for providing a magnetic element in accordance with the present invention. For clarity, the method 200 is described in the context of the magnetic element 100. However, the method 200 could be adapted to other magnetic elements. The pinned layer 104 having its magnetization pinned in a particular direction is provided in step 204. Step 204 could include providing a synthetic pinned layer. The nonmagnetic intermediate layer 106 is provided in step 206. The free layer 108 having its easy axis in a particular direction is provided in step 208. The easy axis of the free layer 108 is oriented at an angle, $\phi$, with respect to the direction in which the magnetization of the pinned layer 104 is set. Step 208 could include providing a synthetic free layer.

Figure 8A:
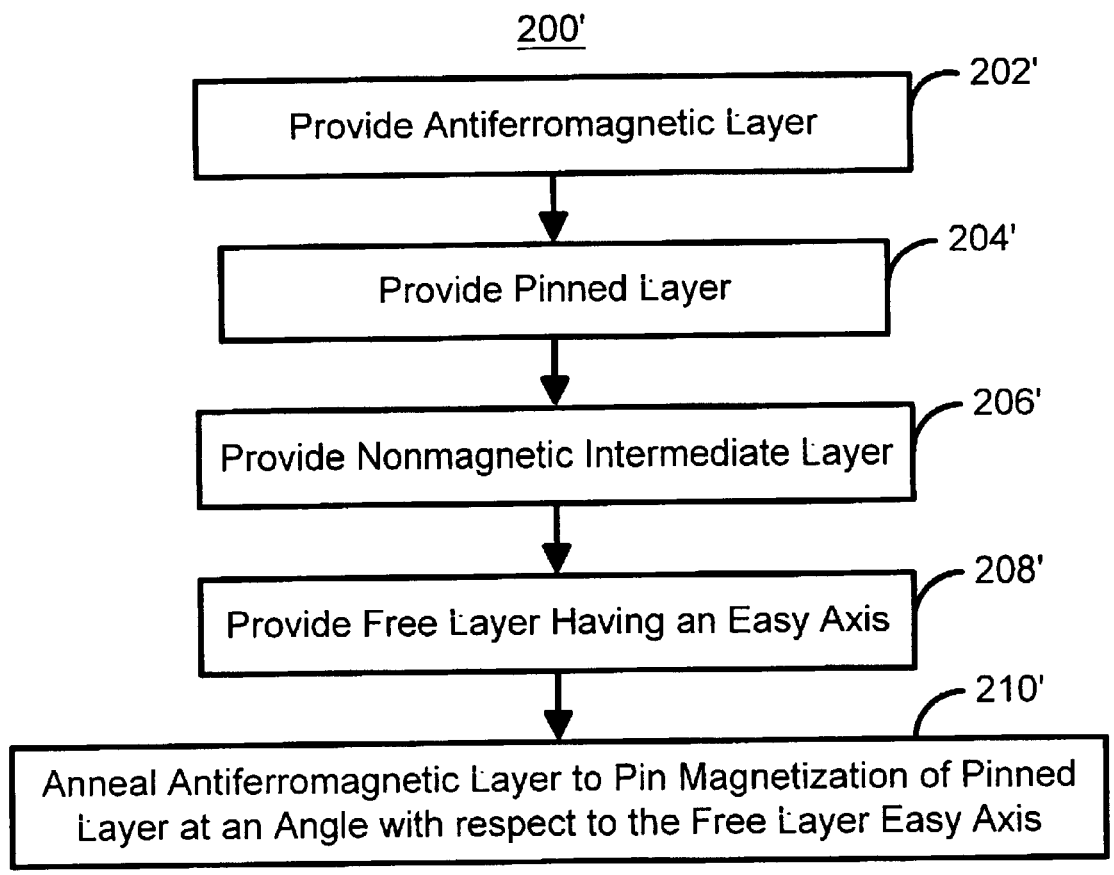
FIG. 8A is a flow chart depicting a first embodiment of a method in accordance with the present invention for providing a magnetic element in accordance with the present invention.
Figure 8B:
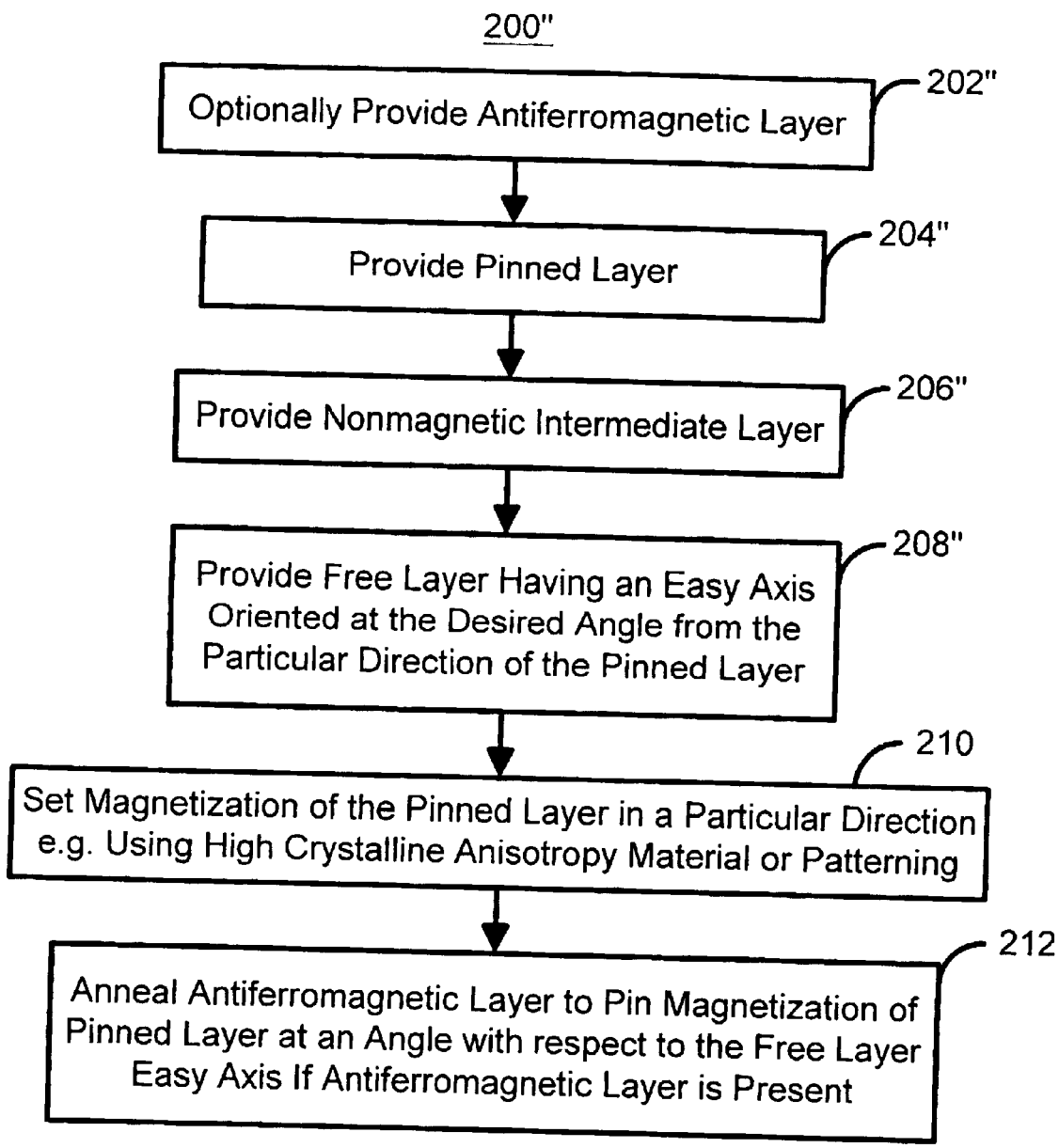
FIG. 8B is a flow chart depicting a second embodiment of a method in accordance with the present invention for providing a magnetic element in accordance with the present invention.
Figure 8C:
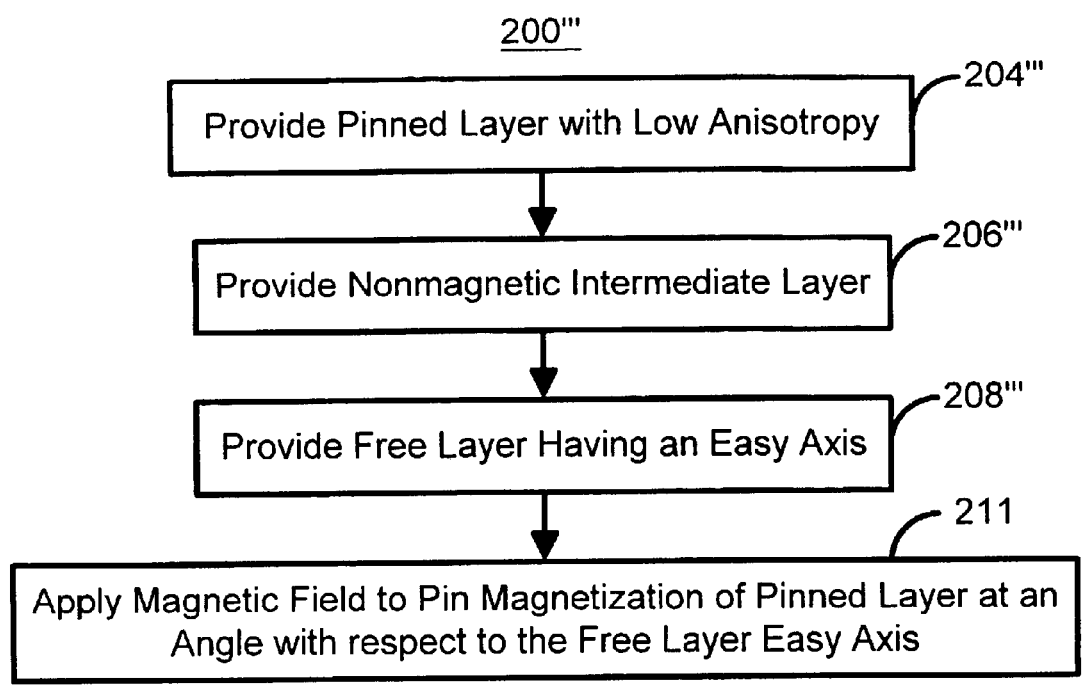
FIG. 8C is a flow chart depicting a third embodiment of amethod in accordance with the present invention for providing a magnetic clement in accordance with the present invention.

FIGS. 8A–8C are more detailed embodiments of various methods for performing the process 200. FIG. 8A is a flow chart depicting a first embodiment of a method 200' in accordance with the present invention for providing a magnetic element in accordance with the present invention. For clarity, the method 200' is described in the context of the magnetic element 100. However, the method 200' could be adapted to other magnetic elements. The antiferromagnetic layer 102 is provided, via step 202'. In a preferred embodiment, the antiferromagnetic layer 102 is provided on the appropriate seed layer. The pinned layer 104 is provided in step 204'. Step 204' could include providing a synthetic pinned layer. The nonmagnetic intermediate layer 106 is provided in step 206'. The free layer 108 having an easy axis in a particular direction is provided in step 208'. Step 208' could include providing a synthetic free layer. The antiferromagnetic layer 102 is annealed at the appropriate temperature and field in order to ensure that the magnetization of the pinned layer 104 is oriented at an angle, $\phi$, with respect to the direction in which easy axis 107 of the free layer 108 is set, via step 210.

FIG. 8B is a flow chart depicting a second embodiment of a method 200" in accordance with the present invention for providing a magnetic element in accordance with the present invention. For clarity, the method 200" is described in the context of the magnetic element 100. However, the method 200" could be adapted to other magnetic elements. The antiferromagnetic layer 102 may optionally be provided, via step 202". In a preferred embodiment, the antiferromagnetic layer 102 is provided on the appropriate seed layer. Flowever, the antiferromagnetic layer 102 may be omitted, in favor of, for example, using just high coercivity induced by shape anisotropy and/or. crystalline anisotropy. The pinned layer 104 is provided in step 204". Step 204" could include providing a synthetic pinned layer. The nonmagnetic intermediate layer 106 is provided in step 206". The free layer 108 having an easy axis in a particular direction is provided in step 208". Step 208" could include providing a synthetic free layer. The magnetization of the pinned layer 104 is set such that the first pinned layer has a magnetization in a particular direction, via step 210. Step 210 can be-performed by using patterning of and/or a high crystalline anisotropy material for the pinned layer 104, and by using antiferromagnetic layer. The direction of the easy axis provided in step 210 is at an angle, $\phi$, from the easy axis of the free layer 108. Finally, the antiferromagnetic layer 102 (if not eliminated) is annealed at the appropriate temperature and field in order to ensure that the magnetization of the pinned layer 104 is oriented on the same easy axis created by its own shape and/or high crystalline anisotropy, via step 212.

FIG. 8C is a flow chart depicting a third embodiment of a method in accordance with the present invention for providing a magnetic element in accordance with the present invention. For clarity, the method 200'" is described in the context of the magnetic element 100. However, the method 200'" could be adapted to other magnetic elements. The pinned layer 104 having a low magnetic anisotropy is provided in step 204'". Step 204'" could include providing a synthetic pinned layer. The nonmagnetic intermediate layer 106 is provided in step 206'". The free layer 108 having an easy axis in a particular direction is provided in step 208'". The free layer 108 provided in step 208'" has a higher anisotropy than the pinned layer 104. Step 208'" could include providing a synthetic free layer. An external magnetic field is applied to ensure that the magnetization of the pinned layer 104 is oriented at an angle, $\phi$, with respect to the direction in which easy axis 107 of the free layer 108 is set, via step 211.

Thus, using the methods 200, 200', 200" and 200'", the magnetic element 100 having the desired properties, particularly the desired orientation between the magnetization of the pinned layer 106 and the easy axis 107 of the free layer 108.

Figure 9A:
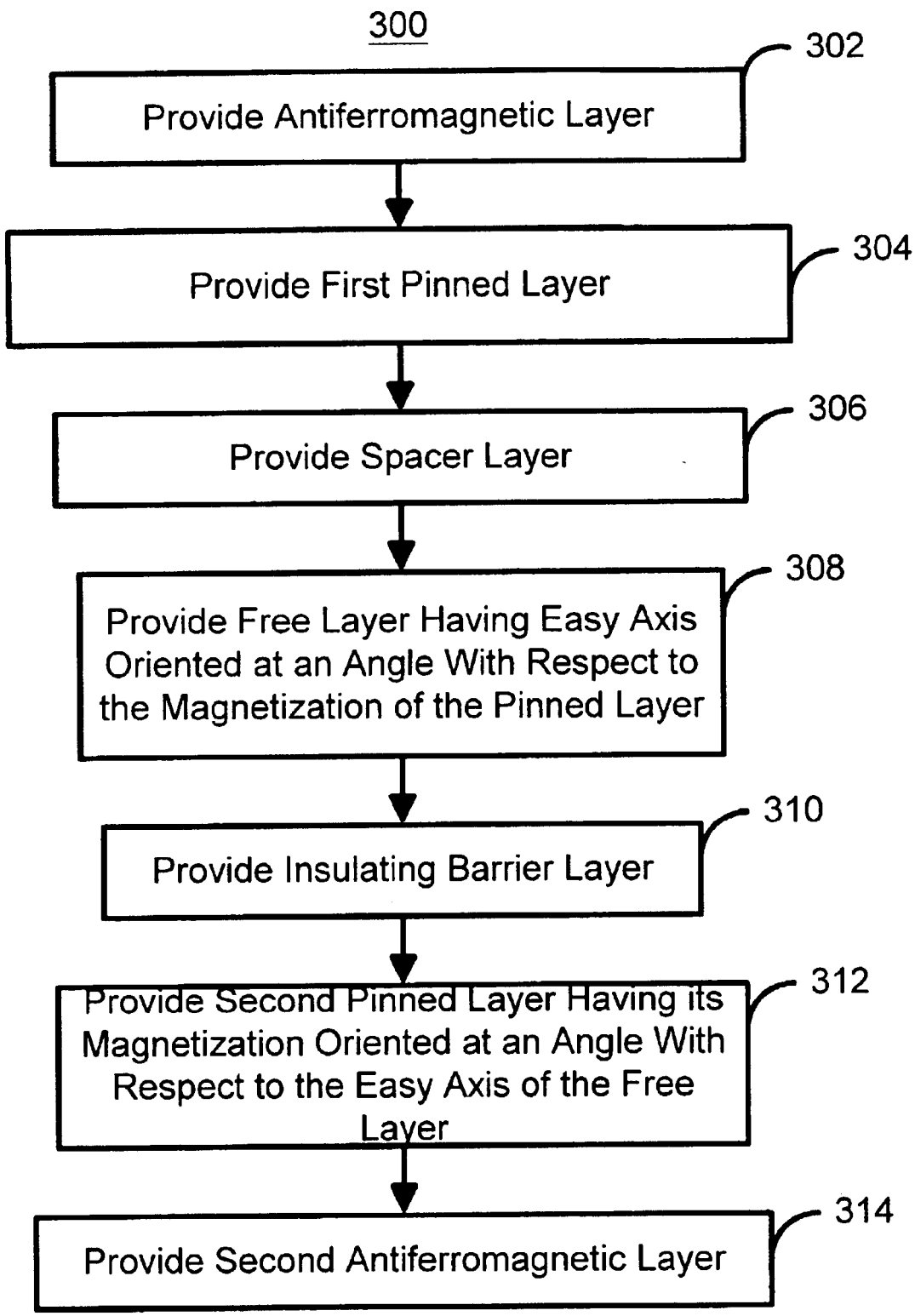
FIG. 9A is a high-level flow chart depicting one embodiment of a method in accordance with the present invention for providing a preferred magnetic element in accordance with the present invention.

FIG. 9A is a high-level flow chart depicting one embodiment of a method 300 in accordance with the present invention for providing a magnetic element in accordance with the present invention. For clarity, the method 300 is described in the context of the magnetic element 100'. Ilowever, the method 300 could be adapted to other magnetic elements. The antiferromagnetic layer 102' is provided, via step 302. In a preferred embodiment, the antiferromagnetic layer 102' is provided on the appropriate seed layer. The first pinned layer 104' and the conductive spacer 106' are provided in steps 304 and 306, respectively. Step 304 could also include providing a synthetic pinned layer. The first pinned layer 104' has its magnetization oriented at a particular angle with respect to the easy axis of the free layer 108', as described below. The free layer 108' and barrier layer 110' are provided in steps 308 and 310, respectively. Step 308 could include providing a synthetic free layer. The free layer 108' provided in step 308 has an easy axis oriented in a particular direction. The magnetization of the first pinned layer 104' is thus at an angle of up with respect to the easy axis 107' of the free layer 108'. The second pinned layer 112' and second antiferromagnetic layer 114' are provided, via steps 312 and 314, respectively. The magnetization of the second pinned layer 112' is oriented at an angle, $\phi$, with respect to the easy axis 107 of the free layer 108'. However, the angle between magnetization of the first pinned layer 104' and the easy axis 107' need not be equal to the angle between the magnetization of the second pinned layer 112' and the free layer 108'. The desired orientations between the magnetization of the pinned layer 104' and the easy axis 107' of the free layer 108' and between the magnetization of the pinned layer 112' and the easy axis 107' of the free layer 108' can be set in a similar manner to the methods 200, 200', 200" and 200'. The magnetic element 100' may then be defined and other processing completed. Thus, using the method 300, the magnetic elements 100' and/or 100" may be fabricated.

In a preferred embodiment, the magnetic element structure 100" is used. The magnetic element 100" essentially includes a simple spin valve (simple pinned layer 104") combined with a synthetic spin tunneling junction (synthetic pinned layer 112"). In such an embodiment, the spin-flop phenomenon can be utilized to help set the magnetizations of the pinned layers 104" and 112" of the spin valve and spin tunneling junction off-axis and on-axis, respectively. In this case, the same antiferromagnetic material for the two antiferromagnetic layers can be used. At a sufficiently high temperature (sufficiently close to the blocking temperature of the antiferromagnets), a magnetic field is applied at the desired angle with respect to the easy axis 107" of the free layer 108". This magnetic field is preferably in the direction that the magnetization of the pinned layer 104" is to be set. Thus, the magnetic field is preferably applied at the angle φ with respect to the easy axis 107". In this magnetic field, the magnetization of the pinned layer 104" in the simple spin valve part of the magnetic element 100" will simply rotate into the magnetic field's direction. The magnetizations of the two synthetic magnetic layers 111 and 115 in the synthetic pinned layer 112", however, will behave differently. The magnetic layers 111 and 115 will behave according to the spin-flip phenomenon. If the magnetic layer 115 adjacent to the antiferromagnetic layer 114" is thinner than the magnetic layer 111, the magnetization of the magnetic layer 115 will rotate in response to the external field. The magnetization of the magnetic layer 115 thus settles in a direction nearly parallel to the direction of the applied magnetic field. In contrast, if the thickness difference between the two synthetic layers and the magnetic field strength are chosen appropriately, the magnetization of the synthetic layer 111 will rotate very little from its original on-axis orientation because of the strong antiferromagnetic coupling (through the nonmagnetic spacer layer 113).

The appropriate magnetic field is still applied during cooling the magnetic element 100" to room temperature. As a result, the magnetization of the pinned layer 104" of the simple spin valve part will be fixed at the desired off-axis angle, φ, by the adjacent antiferromagnetic layer 102". Similarly, the magnetization of the magnetic layer 115, which has essentially not changed direction, is pinned very close to the on-axis direction 107. After cooling, the magnetic field is switched off. The magnetization of the magnetic layer 111 then rotates back to be antiparallel to the (almost) on-axis magnetization of the synthetic layer 115. Thus, by using the spin-flip phenomenon in a single one-step annealing cycle, the pinned layer 104" can be set off-axis to reduce the switching current, while the synthetic pinned layer 112" stays on-axis to maintain the high read signal.

Figure 9B:
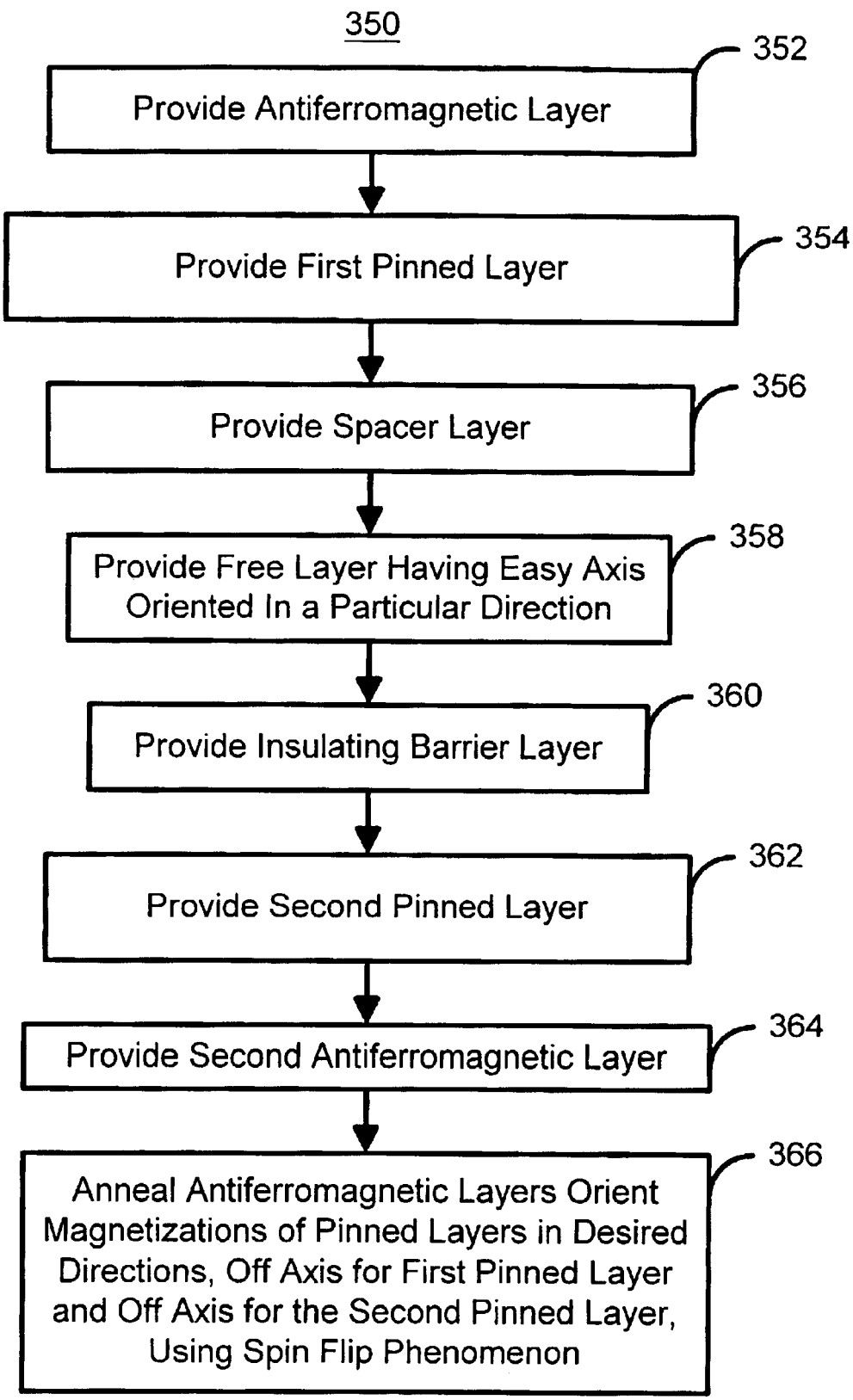
FIG. 9B is a flow chart depicting a preferred embodiment of a method in accordance with the present invention for providing a preferred magnetic element in accordance with the present invention.

FIG. 9B depicts a more detailed flow chart of a method 350 used in providing the magnetic element 100" using the spin flop phenomenon. For clarity, the method 350 is described in the context of the magnetic element 100". However, the method 350 could be adapted to other magnetic elements. The antiferromagnetic layer 102" is provided, via step 352. In a preferred embodiment, the antiferromagnetic layer 102" is provided on the appropriate seed layer. The first pinned layer 104" and the conductive spacer 106" are provided in steps 354 and 356, respectively. The free layer 108" and barrier layer 110" are provided in steps 358 and 360, respectively. Step 358 could include providing a synthetic free layer. The free layer 108" provided in step 358 has an easy axis oriented in a particular direction. The second pinned layer 112" and second antiferromagnctic layer 114" are provided, via steps 362 and 364, respectively. Step 362 preferably include providing two ferromagnetic layers 111 and 115 separated by a nonmagnetic spacer layer 113, preferably composed of Ru. The thicknesses of the ferromagnetic layers 111 and 115 are chosen so that the layer 111 is thicker than the layer 115. The magnetic element 100" is then annealed in the appropriate field oriented at an angle of φ with respect to the easy axis 107", via step 366. The magnitude of the magnetic field applied in step 366 is selected so that the magnetization of the magnetic layer 111 rotates, while the magnetization of the layer 115 remains essentially parallel to the easy axis 107". Step 366 also includes cooling the magnetic element 100" in the field to room temperature. The magnetic element 100' may then be defined and other processing completed. Thus, using the method 350, the magnetic elements 100" may be fabricated.

A method and system has been disclosed for providing a magnetic element that can be written using spin transfer, and thus a smaller and localized switching current, and which provides an adequate read signal. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic element comprising:
   a first pinned layer, the first pinned layer being ferromagnetic and having a first magnetization, the first magnetization being pinned in a first direction;
   a nonmagnetic intermediate layer;
   a free layer, the nonmagnetic intermediate layer residing between the first pinned layer and the free layer, the free layer being ferromagnetic and having a second magnetization with an easy axis in a second direction, the first direction being in the same plane as the second direction and oriented at an angle with respect to the second direction, the angle being different from zero and π radians;
   wherein the magnetic element is configured to allow the second magnetization of the free layer to change direction due to spin transfer when a write current is passed through the magnetic element.

2. The magnetic element of claim 1 wherein the angle is 3π/4 radians.

3. The magnetic element of claim 1 wherein the nonmagnetic intermediate layer is an insulating barrier layer.

4. The magnetic element of claim 1 wherein the nonmagnetic intermediate layer is a nonmagnetic spacer layer that is conductive.

5. The magnetic element of claim 4 further comprising:
   a barrier layer, the barrier layer being an insulator and having a thickness that allows tunneling through the barrier layer;
   a second pinned layer, the second pinned layer being ferromagnetic and having a third magnetization pinned in a third direction, the barrier layer being between the free layer and the second pinned layer.

6. The magnetic element of claim 5 wherein the first direction is opposite to the third direction.

7. The magnetic element of claim 6 wherein the angle is 3π/4 radians.

8. The magnetic element of claim 7 further comprising:
   a first antiferromagnetic layer adjacent to the first pinned layer, the first antiferromagnetic layer for pinning the first magnetization of the first pinned layer; and
   a second antiferromagnctic layer adjacent to the second pinned layer, the second antiferromagnetic layer for pinning the third magnetization of the second pinned layer.

9. The magnetic element of claim 5 wherein the first antiferromagnetic layer and the second antiferromagnetic layer include PtMn.

10. The magnetic element of claim 8 wherein the first antiferromagnetic layer has a first blocking temperature, the second antiferromagnetic layer has a second blocking temperature, the second blocking temperature being different from the first blocking temperature.

11. The magnetic element of claim 4 wherein the first pinned layer is a synthetic pinned layer.

12. The magnetic element of claim 4 wherein the second pinned layer is a synthetic pinned layer.

13. The magnetic element of claim 7 wherein the magnetic element has a width of less than or equal to 200 nm.

14. The magnetic element of claim 11 wherein the magnetic element has a width of approximately 100 nm.

15. The magnetic element of claim 14 wherein the magnetic element has a depth of approximately 50 nm.

16. The magnetic element of claim 4 wherein the free layer is a synthetic free layer.

17. A magnetic memory device comprising:
 a plurality of magnetic cells including a plurality of magnetic elements, each of the plurality of magnetic elements including a first pinned layer, a nonmagnetic intermediate layer, and a free layer, the first pinned layer being ferromagnetic and having a first magnetization, the first magnetization being pinned in a first direction, the nomnagnetic intermediate layer residing between the first pinned layer and the free layer, the free layer being ferromagnetic and having a second magnetization with an easy axis in a second direction, the first direction being in the same plane as the second direction and oriented at an angle with respect to the second direction, the angle being different from zero and $\pi$ radians, wherein the magnetic element is configured to allow the second magnetization of the free layer to change direction due to spin transfer when a write current is passed through the magnetic element, each of the plurality of magnetic elements being configured such that the second magnetization of the free layer can change direction due to spin transfer when a write current is passed through the magnetic element;
 a plurality of row lines coupled to the plurality of magnetic cells; and
 a plurality of column lines coupled with the plurality of cells, the plurality of row lines and the plurality of column lines for selecting a portion of the plurality of magnetic cells for reading and writing.

18. The magnetic memory device of claim 17 wherein the nonmagnetic intermediate layer is an insulating barrier layer.

19. The magnetic memory device of claim 17 wherein the nonmagnetic intermediate layer is a nonmagnetic spacer layer that is conductive.

20. The magnetic memory device of claim 17 wherein the angle is $3\pi/4$ radians.

21. The magnetic memory device of claim 19 further comprising:
 a barrier layer, the barrier layer being an insulator and having a thickness that allows tunneling through the barrier layer;
 a second pinned layer, the second pinned layer being ferromagnetic and having a third magnetization pinned in a third direction, the barrier layer being between the free layer and the second pinned layer.

22. The magnetic memory device of claim 19 wherein the magnetic memory is configured to write to the portion of the plurality of magnetic cells without requiring the use of additional lines.

23. The magnetic memory device of claim 19 wherein the first direction of the first magnetization of the first pinned layer is opposite to the second direction of the third magnetization of the second pinned layer.

24. The magnetic memory device of claim 19 wherein each of the plurality of magnetic elements further include:
 a first antiferromagnetic layer adjacent to the first pinned layer, the first antiferromagnetic layer for pinning the first magnetization of the first pinned layer; and
 a second antiferromagnetic layer adjacent to the second pinned layer, the second antiferromagnetic layer for pinning the third magnetization of the second pinned layer.

25. A method for utilizing a magnetic memory comprising the steps of:
 (a) in a write mode, writing to a first portion of a plurality of magnetic cells by driving a write current in a CPP configuration through the a first portion of a plurality of magnetic elements, each of the plurality of magnetic elements including a first pinned layer, a nonmagnetic intermediate layer, and a free layer, the first pinned layer being ferromagnetic and having a first magnetization, the first magnetization being pinned in a first direction, the nonmagnetic intermediate layer residing between the first pinned layer and the free layer, the free layer being ferromagnetic and having a second magnetization with an easy axis in a second direction, the first direction being in the same plane as the second direction and oriented at an angle with respect to the second direction, the angle being different from zero and $\pi$ radians, wherein the magnetic element is configured to allow the second magnetization of the free layer to change direction due to spin transfer when a write current is passed through the magnetic element, each of the plurality of magnetic elements being configured such that the second magnetization of the free layer can change direction due to spin transfer when a write current is passed through the magnetic element;
 (b) in a read mode, reading a signal from a second portion of the plurality of cells.

26. The method of claim 25 wherein the angle is $3\pi/4$ radians.

27. The method of claim 25 wherein the reading step (b) is performed using a read current two to ten times smaller than the write current to prevent switching during reading.

28. The method of claim 25 wherein the nonmagnetic intermediate layer is an insulating barrier layer.

29. The method of claim 25 wherein the nonmagnetic intermediate layer is a nonmagnetic spacer layer that is conductive.

30. A method for providing magnetic element comprising the steps of:
 (a) providing a first pinned layer, the pinned layer being ferromagnetic and having a first magnetization, the first magnetization being pinned in a first direction;
 (b) providing a nonmagnetic intermediate layer;
 (c) providing a free layer, the nonmagnetic intermediate layer residing between the first pinned layer amd the free layer, the free layer being ferromagnetic and having a second magnetization with an easy axis in a second direction, the first direction being in the same plane as the second direction and oriented at an angle with respect to the second direction, the angle being different from zero and $\pi$ radians;
 wherein the magnetic element is configured to allow the second magnetization of the free layer to change direction due to spin transfer when a write current is passed through the magnetic element.

31. The method of claim 30 wherein the nonmagnetic intermediate layer is an insulating barrier layer.

32. The method of claim 30 wherein the nonmagnetic intermediate layer is a nonmagnetic spacer layer that is conductive.

33. The method of claim 30 wherein the angle is $3\pi/4$ radians.

34. The method of claim 32 further comprising the steps of:
- (d) providing a barrier layer, the barrier layer being an insulator and having a thickness that allows tunneling through the barrier layer;
- (e) providing a second pinned layer, the second pinned layer being ferromagnetic and having a third magnetization pinned in a third direction, the barrier layer being between the free layer and the second pinned layer.

35. The method of claim 34 wherein the first direction is opposite to the second direction.

36. The method of claim 35 further comprising the steps of:
- (f) providing a first antiferromagnetic layer adjacent to the first pinned layer, the first antiferromagnetic layer for pinning the first magnetization of the first pinned layer; and
- (g) providing a second antiferromagnetic layer adjacent to the second pinned layer, the second antiferromagnetic layer for pinning the third magnetization of the second pinned layer.

37. The method of claim 30 further comprising the step of:
- (d) providing a first antiferromagnetic layer adjacent to the first pinned layer, the first antiferromagnetic layer for pinning the first magnetization of the first pinned layer.

38. The method of claim 37 wherein the first antiferromagnetic layer-providing step (d) further includes the step of:
- (d1) annealing the first antiferromagnetic layer in a magnetic field to orient the first antiferromagnetic layer and the first magnetization of the first pinned layer to be oriented in the first direction.

39. The method of claim 30 further comprising the step of:
- (e) patterning the first pinned layer in a first geometry such that the first pinned layer has a second easy axis in the first direction prior to providing the nonmagnetic intermediate layer and the free layer.

40. The method of claim 30 wherein the free layer providing step (c) further includes the step of:
- (c1) patterning the free layer and the nonmnagnetic spacer layer in a second geometry such that the free layer has the easy axis in the second direction.

41. The method of claim 30 wherein the first pinned layer-providing step (a) further includes the step of:
- (a1) providing the first pinned layer with a first magnetic anisotropy less than a second magnetic anisotropy of the free layer, the method further comprising the step of:
- (e) orienting the magnetization of the pinned layer in the first direction by applying an external magnetic field sufficient to orient the pinned layer in the first direction without pinning the free layer in the first direction.

42. The method of claim 36 further comprising the step of:
- (h) annealing the magnetic element so that the first magnetization of the first pinned layer is oriented at the angle with respect to the easy axis of the free layer, while the third magnetization of the second pinned layer is parallel to the easy axis.

* * * * *